(12) United States Patent
Yamazaki et al.

(10) Patent No.: US 6,900,460 B2
(45) Date of Patent: May 31, 2005

(54) SEMICONDUCTOR DEVICE AND METHOD OF MANUFACTURING THE SAME

(75) Inventors: Shunpei Yamazaki, Tokyo (JP); Etsuko Fujimoto, Kanagawa (JP); Satoshi Murakami, Kanagawa (JP); Hideomi Suzawa, Kanagawa (JP); Koji Ono, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/993,993

(22) Filed: Nov. 14, 2001

(65) Prior Publication Data

US 2003/0094614 A1 May 22, 2003

(30) Foreign Application Priority Data

Nov. 14, 2000 (JP) ........................................ 2000-347205

(51) Int. Cl.[7] ........................ H01L 31/036; G02F 1/136
(52) U.S. Cl. ............................ 257/59; 257/72; 257/350; 257/412; 257/413; 349/46
(58) Field of Search ............................ 257/59, 72, 350, 257/351, 412, 413; 349/42, 43, 46

(56) References Cited

U.S. PATENT DOCUMENTS

| 5,990,998 A | 11/1999 | Park et al. |
| 6,031,290 A | 2/2000 | Miyazaki et al. ............ 257/764 |
| 6,365,917 B1 | 4/2002 | Yamazaki ..................... 257/72 |
| 6,475,836 B1 | 11/2002 | Suzawa et al. ............... 438/149 |
| 6,515,336 B1 | 2/2003 | Suzawa et al. ............... 257/350 |
| 6,613,620 B2 | 9/2003 | Fujimoto et al. |
| 2001/0014535 A1 | 8/2001 | Yamazaki |
| 2001/0030322 A1 | 10/2001 | Yamazaki et al. ............ 257/59 |
| 2001/0049197 A1 | 12/2001 | Yamazaki et al. ........... 438/689 |
| 2001/0052950 A1 | 12/2001 | Yamazaki et al. ............. 349/43 |
| 2001/0055841 A1 | 12/2001 | Yamazaki et al. ........... 438/151 |
| 2002/0006705 A1 | 1/2002 | Suzawa et al. .............. 438/279 |
| 2002/0013022 A1 | 1/2002 | Yamazaki et al. ........... 438/166 |
| 2002/0016028 A1 | 2/2002 | Arao et al. .................. 438/149 |
| 2002/0017685 A1 | 2/2002 | Kasahara et al. ............ 257/347 |
| 2002/0102783 A1 | 8/2002 | Fujimoto et al. |
| 2002/0110941 A1 | 8/2002 | Yamazaki et al. ............ 438/25 |
| 2003/0062546 A1 * | 4/2003 | Hamada et al. .............. 257/200 |

FOREIGN PATENT DOCUMENTS

| EP | 1 003 223 A2 | 5/2000 |
| JP | 06-148685 | 5/1994 |
| JP | 07-235680 | 9/1995 |
| JP | 08-274336 | 10/1996 |
| JP | 2001-85700 | 3/2001 |

OTHER PUBLICATIONS

Specification, claims as filed, abstract, drawings, Official Filing Receipt of U.S. Appl. No. 09/433,705, filed Nov. 4, 1999 (not published).
JP 06–148685 English abstract.
JP 07–235680 English abstract.
JP 08–274336 English abstract.
JP 6–148685 full English translation.
JP 7–235680 full English translation.
JP 8–274336 full English translation.

* cited by examiner

*Primary Examiner*—Minh-Loan Tran
(74) *Attorney, Agent, or Firm*—Cook, Alex, McFarron, Manzo, Cummings & Mehler, Ltd.

(57) ABSTRACT

The present invention provides the structure and manufacturing method of a semiconductor device that consumes small power even when a screen is made to be larger. A signal wiring line or a part of a gate wiring line is formed from a low resistant material (typically aluminum) and p-channel TFTs are used for a pixel TFT of a pixel portion. The p-channel TFT in the pixel portion has a multi-gate structure in which a plurality of channel formation regions are provided in order to reduce fluctuation in OFF current.

33 Claims, 14 Drawing Sheets

SEMICONDUCTOR DEVICE AND METHOD OF MANUFACTURING THE SAME

BACKGROUND OF THE INVENTION

1. Field of the Invention

The present invention relates to a semiconductor device having a circuit that comprises a thin film transistor (hereinafter referred to as TFT) and to a method of manufacturing the same. For example, the invention relates to a display device, such as a liquid crystal display device (with a liquid crystal module mounted thereto) and to electronic equipment having the display device as its component.

In this specification, the term semiconductor device refers to devices in general that utilize semiconductor characteristics to function, and electro-optical devices, semiconductor circuits, and electronic equipment are all semiconductor devices.

2. Description of the Related Art

In recent years, a technique of constructing a thin film transistor (TFT) from a semiconductor thin film (thickness: about several nm to several hundreds of nm) formed on a substrate having an insulating surface is drawing attention. Thin film transistors are applied to a wide variety of electronic devices including ICs and electro-optical devices, and rapid development of thin film transistors as switching elements for image display devices is demanded.

Liquid crystal display devices are one of conventionally known image display devices. Active matrix liquid crystal display devices are now employed more often since they can display images with higher definition as compared to passive matrix liquid crystal display devices. In an active matrix liquid crystal display device, pixel electrodes arranged so as to form a matrix are driven to form a display pattern on a screen. Specifically, a voltage is applied between a selected pixel electrode and an opposite electrode associated with the selected pixel electrode to subject a liquid crystal layer placed between the pixel electrode and the opposite electrode to optical modulation. This optical modulation is recognized as a display pattern by an observer.

Uses of active matrix liquid crystal display devices are increasing and they are demanded to be larger in screen size and higher in definition, aperture ratio, and reliability. Also requested are improved productivity and lowered cost.

When aluminum is used as a gate wiring line material in manufacturing a TFT, prior art cannot avoid operation failure of the TFT and degraded TFT characteristics due to heat treatment which causes projections such as hillock or whisker and diffusion of aluminum atoms to a channel formation region. As a countermeasure, a metal material that can withstand the heat treatment, typically a metal element having a high melting point, is used for the gate wiring line. In this case, however, such problems occur that the wiring line resistance is raised as the screen becomes larger and the like, thereby increasing power consumption, etc.

SUMMARY OF THE INVENTION

The present invention has been made in view of the above, and an object of the present invention is therefore to provide the structure and manufacturing method of a semiconductor device that consumes small power even when a screen is made to be larger.

According to the present invention, a signal wiring line and a gate wiring line are formed from a low resistant material (typically aluminum) and a p-channel TFT is used for a pixel TFT in a pixel portion. A gate electrode is placed in a layer different from the layer in which the gate wiring line is formed. The p-channel TFT in a pixel has a multi-gate structure, such as a double gate structure or a triple gate structure, in which a plurality of channel formation regions are provided in order to reduce fluctuation in OFF current.

A structure of the present invention disclosed herein relates to a semiconductor device with TFTs each including a semiconductor layer that is formed on an insulating surface, an insulating film that is formed on the semiconductor layer, and a gate electrode that is formed on the insulating film, the device characterized in that:

a pixel portion having a p-channel TFT and a driving circuit having an n-channel TFT and a p-channel TFT are provided;

the gate electrode of the n-channel TFT has a laminate structure with a first conductive layer as a lower layer and a second conductive layer as an upper layer, the first conductive layer having a first width and a second conductive layer having a second width that is narrower than the first width; and the gate electrode of the p-channel TFT has a laminate structure comprising a first conductive layer and a second conductive layer, the first conductive layer and the second conductive layer having the same width.

In the above structure, the edge of the first conductive layer of the n-channel TFT is tapered. The tapered portion is a region that does not overlap the second conductive layer. The width of the region is obtained by subtracting the second width from the first width. The second conductive layer is also tapered but has a taper angle larger than that of the tapered portion of the first conductive layer.

In the above structures, the p-channel TFT of the pixel portion has a multi-gate structure and includes a plurality of channel formation regions that overlap gate electrodes and impurity regions that are in contact with the channel formation regions. The impurity regions are source regions or drain regions.

Here, a first angle formed by a bottom surface and a side surface of the first conductive layer of the p-channel TFT may be larger than a second angle formed by a bottom surface and a side surface of the second conductive layer of the p-channel TFT.

In the above structures, the n-channel TFT of the driving circuit has a gate electrode, a channel formation region, and an impurity region the gate electrode having a tapered portion, the channel formation region overlapping the gate electrode, and the impurity region partially overlapping the gate electrode. In the above structures, the semiconductor device is characterized in that the impurity region of the n-channel TFT includes a source region or a drain region.

The p-channel TFT may be constructed so as to have LDD regions between the channel formation regions and the source regions, or between the channel formation regions and the drain regions.

The p-channel TFT may be constructed so as to have offset regions between the channel formation regions and the source regions, or between the channel formation regions and the drain regions.

In this specification, an offset region refers to a region of an active layer which has almost the same impurity concentration as the concentration of impurities contained in a channel formation region and which does not overlap a gate electrode.

In the above structures, the impurity element that imparts to a semiconductor an n type conductivity is phosphorus (P)

or arsenic (As) and an n-channel TFT is obtained. The impurity element that imparts to a semiconductor a p type conductivity is boron (B) and a p-channel TFT is obtained.

A structure of the present invention in order to attain the above structures relates to a method of manufacturing a semiconductor device that has on an insulating surface an n-channel TFT and a p-channel TFT, the n-channel TFT having a first semiconductor layer and a first gate electrode, the p-channel TFT having a second semiconductor layer and a second gate electrode, the method comprising the steps of:

forming the first semiconductor layer and the second semiconductor layer on the insulating surface;

forming an insulating film on the first semiconductor layer and the second semiconductor layer;

forming a first gate electrode on the insulating film, the first gate electrode having a tapered portion;

doping the first semiconductor layer with an impurity element that imparts the n type conductivity using the first gate electrode as a mask to form an n type impurity region;

forming a second gate electrode through selective removal in which only the tapered portion of the first gate electrode above the second semiconductor layer is removed; and doping the second semiconductor layer with an impurity element that imparts the p type conductivity using the second gate electrode as a mask to form a p type impurity region.

In the above structure regarding a method of manufacturing a semiconductor device, the method is characterized in that a resist mask used to dope the semiconductor layer with an impurity that imparts the p type conductivity is the same as a resist mask for removing only the tapered portion of the gate electrode.

Another structure of the present invention relates to a semiconductor device with TFTs each including a semiconductor layer that is formed on an insulating surface, an insulating film that is formed on the semiconductor layer, and a gate electrode that is formed on the insulating film, the device characterized in that:

a pixel portion having a p-channel TFT and a driving circuit having an n-channel TFT and a p-channel TFT are provided;

the p-channel TFT of the pixel portion has gate electrodes, a plurality of channel formation regions, and impurity regions, the gate electrodes each having a tapered portion, the channel formation regions overlapping the gate electrodes, and the impurity region partially overlapping the gate electrodes; and the n-channel TFT of the driving circuit has a gate electrode, a channel formation region, and an impurity region, the gate electrode having a tapered portion, the channel formation region overlapping the gate electrode, and the impurity region partially overlapping the gate electrode.

In the above structure, the semiconductor device is characterized in that the gate electrodes of the n-channel TFT and of the p-channel TFT have a laminate structure with a first conductive layer as a lower layer and a second conductive layer as an upper layer, the first conductive layer having a first width and a second conductive layer having a second width that is narrower than the first width.

A structure of the present invention in order to attain the above structures relates to a method of manufacturing a semiconductor device that has on an insulating surface an n-channel TFT and a p-channel TFT, the n-channel TFT having a first semiconductor layer and a first gate electrode, the p-channel TFT having a second semiconductor layer and a second gate electrode, the method comprising the steps of:

forming the first semiconductor layer and the second semiconductor layer on the insulating surface;

forming an insulating film on the first semiconductor layer and the second semiconductor layer;

forming a first gate electrode on the insulating film, the first gate electrode having a tapered portion;

doping the first semiconductor layer with an impurity element that imparts the n type conductivity using the first gate electrode as a mask to form an n type impurity region;

doping the second semiconductor layer with an impurity element that imparts the p type conductivity using the first gate electrode as a mask to form a p type impurity region; and forming a second gate electrode through selective removal in which only the tapered portion of the first gate electrode above the second semiconductor layer is removed.

In the above structure regarding a method of manufacturing a semiconductor device, the method is characterized in that, in the step of forming the p type impurity region, the second semiconductor layer is doped with an impurity element that imparts the p type conductivity through the tapered portion of the first gate electrode to form an impurity region whose impurity concentration increases toward the edge of the tapered portion.

In the above structures regarding a method of manufacturing a semiconductor device, the method is characterized in that a resist mask used to dope the semiconductor layer with an impurity that imparts the p type conductivity is the same as a resist mask for removing only the tapered portion of the gate electrode.

In the above two structures regarding a method of manufacturing a semiconductor device, the method is characterized in that the first gate electrode has a laminate structure with a first conductive layer as a lower layer and a second conductive layer as an upper layer, the first conductive layer having a first width and a second conductive layer having a second width that is narrower than the first width. A region of the first conductive layer that does not overlap the second conductive layer is tapered in section.

In the above two structures regarding a method of manufacturing a semiconductor device, the method is characterized in that, in the step of forming the n type impurity region, the first semiconductor layer is doped with an impurity element that imparts the n type conductivity through the tapered portion of the first gate electrode to form an impurity region whose impurity concentration increases toward the edge of the tapered portion.

In the above two structures regarding a method of manufacturing a semiconductor device, the method is characterized by further comprising the steps of:

forming a first insulating film after the gate electrode is formed so as to cover the gate electrode;

forming a source wiring line on the first insulating film;

forming a second insulating film that covers the source wiring line; and forming a gate wiring line on the second insulating film.

In the above two structures regarding a method of manufacturing a semiconductor device, the method is characterized in that a driving circuit having the n-channel TFT and the p-channel TFT is formed.

In the above two structures regarding a method of manufacturing a semiconductor device, the method is characterized in that a pixel TFT comprising the p-channel TFT is formed.

In this way, the present invention can provide the structure and manufacturing method of a semiconductor device that consumes small power even when a screen is made larger.

DETAILED DESCRIPTION OF THE PREFERRED EMBODIMENTS

Figure 1:
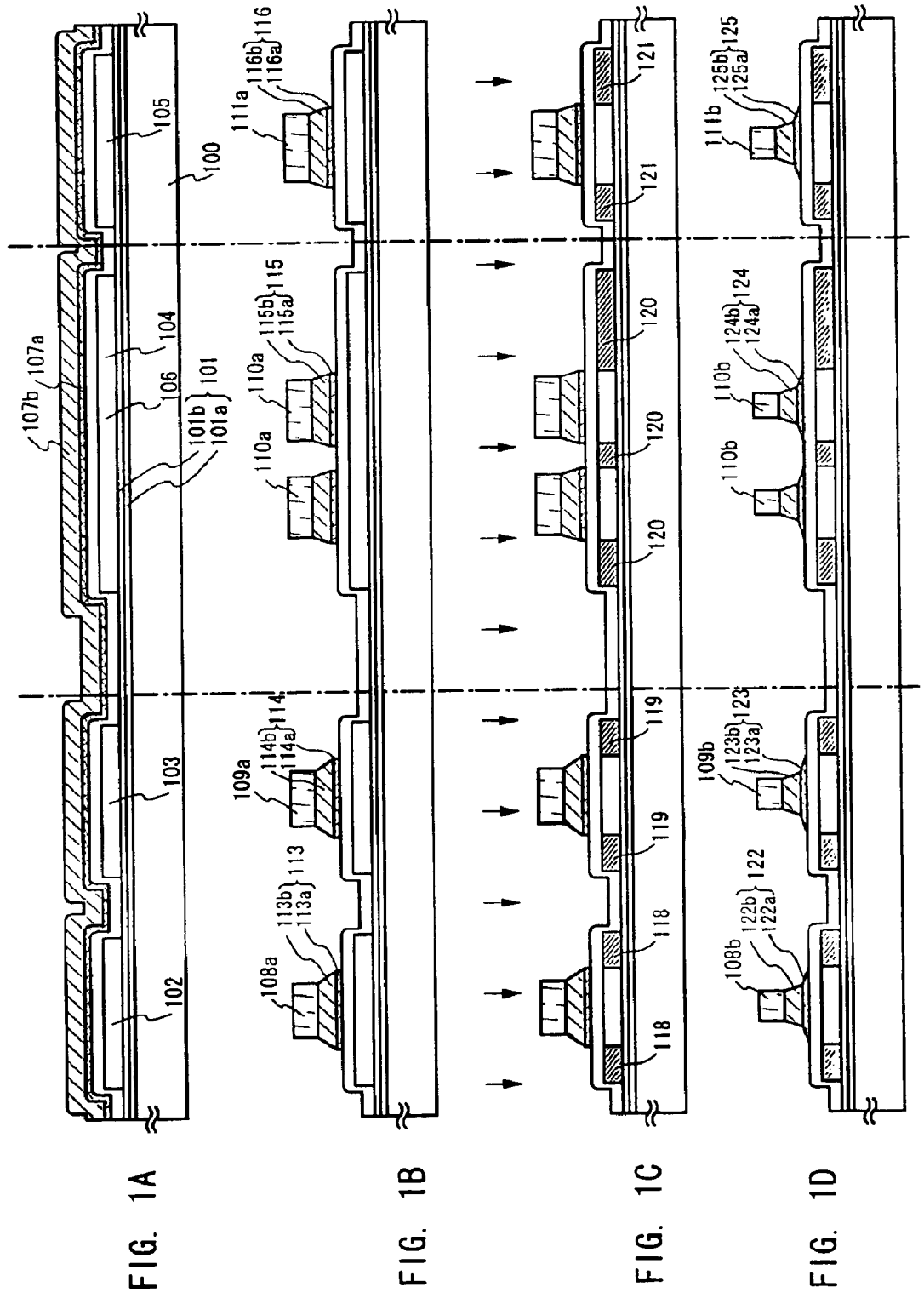
FIGS. 1A to 1D are diagrams showing a process of manufacturing an AM-LCD.
Figure 2:
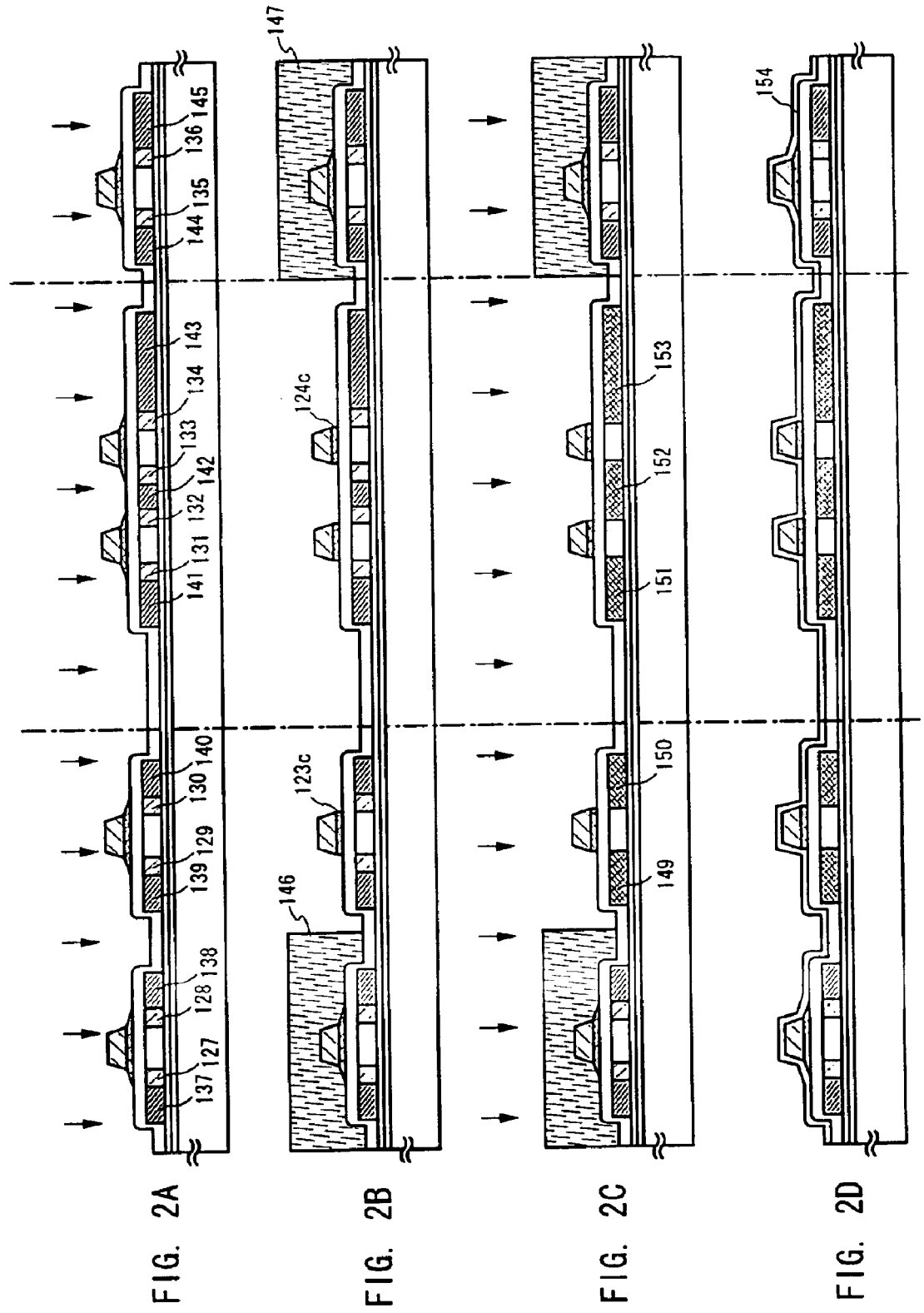
FIGS. 2A to 2D are diagrams showing the process of manufacturing an AM-LCD.

An embodiment mode of the present invention will be described below.

First, a base insulating film is formed on a substrate. Then semiconductor layers of desired shapes are formed in a first photolithography step.

Formed next is an insulating film (including a gate insulating film) that covers the semiconductor layers. A first conductive film and a second conductive film are layered on the insulating film. The laminate films are subjected to first etching treatment in a second photolithography step to form a gate electrode from the first conductive film and the second conductive film. In the present invention, the gate electrode is formed first and then a gate wiring line is formed on an interlayer insulating film.

Leaving a resist mask that has been formed in the second photolithography step as it is, the semiconductor is doped with an impurity element that imparts the n type conductivity (phosphorus or the like) to form an n type impurity region (high concentration) in a self-aligning manner.

Still keeping the resist mask that has been formed in the second photolithography step in its place, etching conditions are changed and second etching treatment is carried out to form a first conductive layer (a first width) and a second conductive layer (a second width) that have tapered portions. The first width is greater than the second width. An electrode comprising the first conductive layer and the second conductive layer serves as a gate electrode of an n-channel TFT (a first gate electrode).

After removing the resist mask, the second conductive layer is used as a mask to dope the semiconductor layers with an impurity element that imparts the n type conductivity through the tapered portion of the first conductive layer. As a result, a channel formation region is formed below the second conductive layer and formed below the first conductive layer is an impurity region (low concentration) whose impurity concentration gradually increases as the distance from the channel formation region is increased.

Next, a resist mask is formed in a third photolithography step so as to cover at least the region to become the n-channel TFT.

Third etching treatment is carried out next to remove the tapered portion of the first conductive layer that is not covered with the resist mask, namely, a portion of the first conductive layer that does not overlap the second conductive layer. In the third etching treatment, the second conductive layer is used as a mask. As a result, the width of the first conductive layer becomes almost the same as the width of the second conductive layer and an electrode comprising the first conductive layer and the second conductive layer of this point serves as a gate electrode of a p-channel TFT (a second gate electrode).

Leaving the resist mask that has been formed in the third photolithography step as it is, the semiconductor is doped with an impurity element that imparts the p type conductivity to form a p type impurity region.

An insulating film for protecting the gate electrode is formed next. Then the impurity elements used to dope the semiconductor layers are activated and a source wiring line is formed on the insulating film from a low resistance metal material (typically a material containing aluminum as its main ingredient) in a fourth photolithography step. Since the source wiring line is formed from a low resistance metal material in the present invention, sufficient driving is obtained even when a pixel portion is made to have a larger area.

Then an interlayer insulating film is formed and a fifth photolithography step is conducted to form contact holes. Formed here are contact holes reaching the impurity regions, contact holes reaching the gate electrodes, and a contact hole reaching the source wiring line.

A conductive film is formed next from a low resistance metal material. In a sixth photolithography step, a gate wiring line, an electrode that connects the source wiring line with the impurity region, and a pixel electrode are formed. According to the present invention, the gate wiring line is electrically connected to the first gate electrode or the second gate electrode through the contact hole formed in the interlayer insulating film. The source wiring line is electrically connected to the impurity region (source region) through the contact hole formed in the interlayer insulating film. The pixel electrode is electrically connected to the impurity region (drain region) through the contact hole formed in the interlayer insulating film. The material for the conductive film is preferably a highly reflective metal material since the conductive film constitutes the pixel electrode. Typically, a material mainly containing aluminum or silver is used. With the gate wiring line formed from a low resistance metal material, the present invention can obtain sufficient driving even when the pixel is made to have a larger area.

Through the photolithography steps six times in total, namely, six masks, an element substrate is completed which is provided with a pixel portion having a pixel TFT (a p-channel TFT) and with a driving circuit having a CMOS circuit (an n-channel TFT and a p-channel TFT).

Shown here is a case of doping the semiconductor with an impurity element that imparts the p type conductivity after the third etching. However, the third etching may be conducted after doping of an impurity element that imparts the p type conductivity.

A transmissive liquid crystal display device can be manufactured if the pixel electrode is formed from a light transmissive conductive film and one more mask is used to pattern the film into a desired shape.

More detailed descriptions will be given on the present invention structured as above through embodiments shown below.

[Embodiment 1]

In this embodiment, a method of simultaneously manufacturing a pixel portion (p-channel TFT) and TFTs (n-channel TFT and p-channel TFT) comprising a CMOS circuit of a driving circuit, which is provided on the periphery of the pixel portion, on the same substrate will be described with reference to FIGS. 1 to 4.

In this embodiment, a substrate 100 is used, which is made of barium borosilicate glass such as #7059 glass and #1737 glass produced by Corning Corp. or aluminoborosilicate glass. As the substrate 100, any substrate can be used. A quartz substrate, a silicon substrate, a metal substrate, or stainless substrate forming an insulating film on the surface may be used. A plastic substrate having heat resistance enduring a treatment temperature of this embodiment also may be used.

Then, an underlying film 101 comprising an insulating film such as a silicon oxide film, a silicon nitride film, or a silicon oxide nitride film is formed on the substrate 100. In this embodiment, a two-layered structure is used as the underlying film 101. However, a single insulating film or a lamination of two or more insulating films using the above insulating film may also be used. As a first layer of the underlying film 101, a silicon oxide nitride film 101a is formed to a thickness of 10 to 200 nm (preferably. 50 to 100 nm) by plasma CVD, using $SiH_4$, $NH_3$, and $N_2O$ as reactive gas. In this embodiment, a silicon oxide nitride film 101a (a composition ratio: Si=32%, O=27%, N=24%, and H=17%) having a thickness of 50 nm is formed. Then, as a second layer of underlying film 101, a silicon oxide nitride film 101b is formed to a thickness of 50 to 200 nm (preferably, 100 to 150 nm) by plasma CVD, using $SiH_4$ and $N_2O$ as reactive gas. In this embodiment, a silicon oxide nitride film (a composition ratio: Si=32%, O=59%, N=7%, and H=2%) having a thickness of 100 nm is formed.

Then, semiconductor layers 102 to 105 are formed on the underlying film. The semiconductor layers 102 to 105 are formed by forming a semiconductor film having an amorphous structure by a known method (sputtering, LPCVD plasma CVD, or the like), conducting a known crystallization precessing (laser crystallization, thermal crystallization, or thermal crystallization using a catalyst such as nickel) to obtain a crystalline semiconductor film, and patterning the film into a desired shape. The semiconductor layers 102 to 105 are formed to a thickness of 25 to 80 nm (preferably. 30 to 60 nm). There is no particular limit regarding the material for the crystalline semiconductor film. However, it is preferable to form the crystalline semiconductor film of silicon or a silicon germanium alloy. In this embodiment, an amorphous silicon film of 55 nm is formed by plasma CVD, and thereafter, a solution containing nickel is held on the amorphous silicon film. The amorphous silicon film is dehydrogenated (at 500° C., for one hour), and then subjected to thermal crystallization (at 550° C., for 4 hours). Furthermore, laser annealing is conducted for the purpose of improving crystallization, whereby a crystalline silicon film is formed. The crystalline silicon film is subjected to patterning by photolithography to form the semiconductor layers 102 to 105.

Furthermore, after the semiconductor layers 102 to 105 are formed, doping of a trace amount of impurity elements (boron or phosphorus) may be appropriately conducted so as to control a threshold value of TFTs.

Furthermore, in the case of manufacturing a crystalline semiconductor film by laser crystallization, a pulse-oscillation type or continuous light emission type excimer laser, a YAG laser, and a $YVO_4$ laser can be used. When using these lasers, laser light emitted from a laser oscillator may be condensed into a line shape by an optical system and allowed to radiate to a semiconductor film. Crystallization conditions are appropriately selected by the operator. However, when using a pulse oscillation excimer laser, a pulse oscillation frequency is set to be 30 Hz, and a laser energy density is set to be 100 to 400 $mJ/cm^2$ (typically 200 to 300 $mJ/cm^2$). In the case of using a pulse oscillation YAG laser, the second harmonic thereof may be used, a pulse oscillation frequency may be set to be 1 to 10 kHz, and a laser energy density may be set to be 300 to 600 $mJ/cm^2$ (typically, 350 to 500 $mJ/cm^2$). Laser light condensed in a line shape with a width of 100 to 1000 μm (e.g., 400 μm) may be radiated over the entire surface of a substrate, and a line-shaped laser light overlap ratio at this time may be set to be 80 to 98%.

Figure 11:
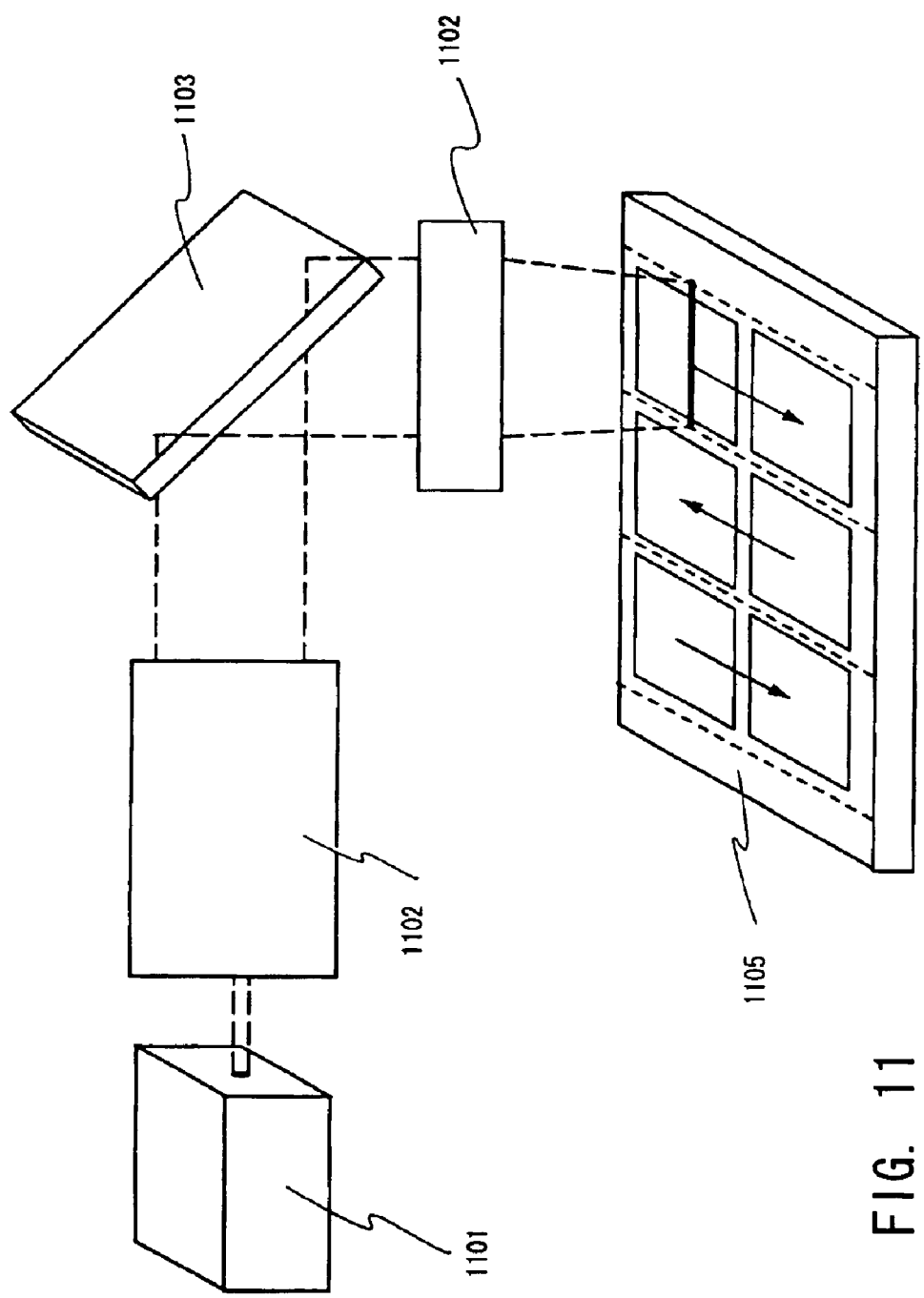
FIG. 11 is a schematic diagram illustrating laser irradiation.

In addition, the state of laser radiation is shown briefly in FIG. 11. The laser light emitted from the laser light source 1101 is radiated to a big substrate by the optical system 1102 and the mirror 1103. The arrow on the big substrate shows a scanning direction of the laser light. FIG. 11 shows executing a multiple pattern to form six substrates sized 12.1 inches from the big substrate 1105 sized 650×550 nm.

Then, a gate insulating film 106 is formed so as to cover the semiconductor layers 102 to 105. The gate insulating film 106 is formed of an insulating film containing silicon so as to have a thickness of 40 to 150 nm by plasma CVD or sputtering. In this embodiment, a silicon oxide nitride film (a composition ratio: Si=32%, O=59%, N=7%, and H=2%) is formed to a thickness of 115 nm by plasma CVD. Needless to say, the gate insulating film is not limited to a silicon oxide nitride film, and may have a single layer or multilayered structure of insulating films containing silicon.

Then, as shown in FIG. 1A, a first conductive film 107a (thickness: 20 to 100 nm) and a second conductive film 107b (thickness: 100 to 400 nm) are laminated on the gate insulating film 106. In this embodiment, the first conductive film 107a made of a TaN film having a thickness of 30 nm and the second conductive film 107b made of a W film having a thickness of 370 nm are laminated thereon. The TaN film is formed by sputtering using Ta as a target in an atmosphere containing nitrogen. The W film is formed by sputtering using W as a target. The W film can also be formed by thermal CVD using tungsten hexafluoride ($WF_6$). In any case, it is required to lower a resistance in order to use the W film as a gate electrode, and it is desirable that a resistance ratio of the W film is 20 μΩcm or less. The resistance ratio of the W film can be lowered by enlarging crystal grains thereof. However, in the case where there are a number of impurity elements such as oxygen in the W film, crystallization is inhibited, and the resistance of the W film is increased. Therefore, in this embodiment, the W film is formed by sputtering using high-purity W (purity:

99.9999%) as a target so that no impurity may be allowed to enter in the W film from a vapor phase during the film formation, whereby a resistance ratio of 9 to 20 $\mu\Omega$cm can be achieved.

In this embodiment, the first conductive film 107a is made of TaN, and the second conductive film 107b is made of W. However, the present invention is not limited thereto. Both the films may be formed of an element selected from Ta, W, Ti, Mo, Al, Cu, Cr, and Nd, or an alloy material containing the element as its main component or a compound material. A semiconductor film such as a polycrystalline silicon film doped with an impurity element such as phosphorus may also be used. Furthermore, the following combination may be used: the first conductive film made of a tantalum (Ta) film and the second conductive film made of a W film; the first conductive film made of a titanium nitride (TiN) film and the second conductive film made of a W film; the first conductive film made of a tantalum nitride (TaN) film and the second conductive film made of an Al film; the first conductive film made of tantalum nitride (TaN) film and the second conductive film made of a Cu film.

Then, masks 108a to 111a made of a resist are formed by photolithography, and first etching processing for forming electrodes and wiring is conducted. The first etching processing is conducted as first and second etching conditions. In this embodiment, under the first etching condition, etching is conducted by an inductively coupled plasma (ICP) etching method, in which plasma is generated by using $CF_4$, $Cl_2$, and $O_2$ as etching gas (a flow rate: 25/25/10 (sccm)) with an RF power (13.56 MHZ) of 500 W supplied to a coil-shaped electrode at a pressure of 1 Pa. As the etching gas, chlorine type gas such as $Cl_2$, $BCl_3$, $SiCl_4$, and $CCl_4$ or fluorine gas such as $CF_4$, $SF_6$, and $NF_3$, or $O_2$ can be appropriately used. Herein, a dry etching apparatus (Model E645-ICP) using ICP produced by Matsushita electric Industrial Co. Ltd. is used. An RF power (13.56 MHZ) of 150 W is also applied to the substrate side (a sample stage), whereby a substantially negative self-bias voltage is applied thereto. Under the first etching condition, the W film is etched and end portions of the first conductive layer are tapered. Under the first etching condition, an etching rate with respect to W is 200.39 nm/min., an etching rate with respect to TaN is 80.32 nm/min, and a selection ratio of W with respect to TaN is about 2.5. Furthermore, under the first etching condition, a taper angle of W becomes about 26°.

Thereafter, without removing the masks 108a to 111a made of resist, etching is conducted for about 30 seconds under the second etching condition, in which plasma is generated by using $CF_4$ and $Cl_2$ as etching gas (flow a rate ratio: 30/30 (sccm)) with an RF power (13.56 MHZ) of 500 W supplied to a coil-shaped electrode at a pressure of 1 Pa. An RF power (13.56 MHZ) of 20 W is also applied to the substrate side (a sample stage), whereby a substantially negative self-bias voltage is applied thereto. Under the second etching condition using a mixture of $CF_4$ and $Cl_2$ as etching gas, the W film and the TaN film are etched to the same degree. Under the second etching condition, an etching rate with respect to W is 58.97 nm/min., and an etching rate with respect to TaN is 66.43 nm/min. In order to conduct etching without leaving any residual on the gate insulating film, an etching time may be increased by about 10 to 20%.

According to the first etching processing, by appropriately prescribing the shape of a resist mask, the end portions of the first conductive layer and the second conductive layer are tapered due to the effect of a bias voltage applied to the substrate side. The angle of the taper portion may be 15° to 45°.

Thus, conductive layers 113 to 116 (first conductive layers 113a to 116a and second conductive layers 113b to 116b) of a first shape comprising first conductive layers and second conductive layers are formed by the first etching processing. (FIG. 1B) The width of the first conductive layer in the channel length direction corresponds to WI shown in the above embodiment mode. Although not shown, regions of the insulating film 106 to be a gate insulating film, not covered with the conductive layers 113 to 116 of a first shape, are etched by about 10 to 20 nm to be thin.

Without removing the resist masks, first doping processing is conducted, whereby an impurity element providing an n-type is added to the semiconductor layers (FIG. 1C). The doping processing may be conducted by ion doping or ion implantation. Ion doping is conducted under the conditions of a dose amount of $1\times10^{13}$ to $5\times10^{15}/cm^2$ and an acceleration voltage of 60 to 100 keV. In this embodiment, doping is conducted at a dose amount of $1.5\times10^{15}/cm^2$ and an acceleration voltage of 80 keV. As the impurity element providing an n-type, an element belonging to Group 15, typically, phosphorus (P) or arsenic (As) is used. Herein, phosphorus (P) is used. In this case, the conductive layers 113 to 116 function as masks with respect to the impurity element providing an n-type, whereby high-concentration impurity regions 118 to 121 are formed in a self-alignment manner. An impurity element imparting an n-type is added to the high-concentration impurity regions 118 to 121 in a concentration of $1\times10^{20}$ to $1\times10^{21}/cm^3$.

Then, without removing the resist masks, second etching processing is conducted. Herein, etching is conducted for 25 seconds by using $SF_6$, $Cl_2$, and $O_2$ as etching gas (flow rate ratio: 24/12/24 (sccm)) with an RF power (13.56 MHZ) of 700 W supplied to a coil-shaped electrode at a pressure of 1.3 Pa to thereby generate plasma. An RF power (13.56 MHZ) of 10 W is also applied to the substrate side (sample stage), whereby a substantially negative self-bias voltage is applied thereto. In the second etching processing, an etching rate with respect to W is 227.3 nm/min., an etching rate with respect to TaN is 32.1 nm/min., and a selection ratio of W with respect to TaN is 7.1. An etching rate with respect to SiON that is the insulating film 106 is 33.7 nm/min., and a selection ratio of W with respect to TaN is 6.83. In the case of using $SF_6$ as the etching gas, a selection ratio with respect to the insulating film 106 is high, so that a decrease in a film thickness can be suppressed.

The taper angle of W becomes 70° in the second etching processing. Furthermore, in the second etching processing, second conductive layers 122b to 125b are formed. On the other hand, the first conductive layers are hardly etched to form first conductive layers 122a to 125a. (FIG. 1D) Although not shown, actually, the width of the first conductive layers is narrowed by about 0.3 $\mu$m (i.e., about 0.6 $\mu$m over the total line width) compared with the state before the second etching processing. Furthermore, the width of the second conductive layer in the channel length direction corresponds to the second width shown in the embodiment mode.

The electrode formed by the first conductive layer 122a and the second conductive layer 122b is to be the gate electrode of the n-channel TFT of the CMOS circuit formed by the following steps. The electrode formed by the first conductive layer 125a and the second conductive layer 125b is to be an electrode either of the retention capacitor formed by the following steps.

It is also possible to use $CF_4$, $Cl_2$, and $O_2$ as the etching gas in the second etching processing. In this case, etching may be conducted by generating plasma under a flow rate ratio of 25/25/10 (sccm) with an RF power (13.56 MHZ) of 500 W supplied to a coil-shaped electrode at a pressure of 1 Pa. An RF power (13.56 MHZ) of 20 W is also applied to the substrate side (sample stage), whereby a substantially negative self bias voltage is applied thereto. In the case of using $CF_4$, $Cl_2$, and $O_2$, an etching rate with respect to W is 124.62 nm/min., an etching rate with respect to TaN is 20.67 nm/min., and a selection ratio of W with respect to TaN is 6.05. Thus, the W film is selectively etched. Furthermore, in this case, the regions of the insulating film 106, not covered with the conductive layers 122 to 125 of a first shape, are etched by about 50 nm to be thin.

Then, after removing the resist masks, second doping processing is conducted to obtain a state shown in FIG. 2A. Doping is conducted using the second conductive layers 122b to 125b as masks with respect to an impurity element so that the impurity element is added to the semiconductor layers below the taper portions of the first conductive layers. In this embodiment, phosphorus (P) is used as the impurity element, and plasma doping is conducted under the doping conditions of a dose amount of $1.5 \times 10^{14}/cm^2$, an acceleration voltage of 90 keV, an ion current density of 0.5 $\mu A/cm^2$, phosphine ($PH_3$) 5% hydrogen dilute gas, and a flow rate of 30 sccm. Thus, low-concentration impurity regions 127 to 136 are formed so as to be overlapped with the first conductive layers in a self-alignment manner. The concentration of phosphorus (P) added to the low-concentration impurity regions 127 to 136 is $1 \times 10^{17}$ to $1 \times 10^{19}/cm^2$, and the low-concentration impurity regions 127 to 136 have a concentration gradient in accordance with the thickness of the taper portions of the first conductive layers. In the semiconductor layer overlapped with the taper portion of the first conductive layer, an impurity concentration (P concentration) decreases gradually from the end of the taper portion of the first conductive layer inwardly. More specifically, in the second doping processing, a concentration distribution is formed. Furthermore, an impurity element is also added to the high-concentration impurity regions 118 to 121 to form high-concentration impurity regions 137 to 145.

In this embodiment, the width of the tapered portion (the width in the channel length direction) is preferably at least 0.5 $\mu$m or more and the upper limit thereof is 1.5 to 2 $\mu$m. Accordingly, though depending on the film thickness, the upper limit is also 1.5 to 2 $\mu$m for the width in the channel length direction of an impurity region (low concentration) having a concentration gradient. An impurity region (high concentration) and an impurity region (low concentration) are shown as separate regions in the drawing. In fact, there is no definite border is but merely a region having a concentration gradient. Similarly, a channel formation region and an impurity region (low concentration) do not have a definite border between them.

Next, the semiconductor layers that are to serve as active layers of n-channel TFTs are covered with resist masks 146 and 147 to conduct third etching treatment. In the third etching treatment, the tapered portions of the first conductive layers are selectively etched so as to remove the regions that overlap the semiconductor layers. The third etching treatment uses as etching gas $Cl_3$ that has a high selective ratio with respect to W and employs an ICP etching device. In this embodiment, the gas flow rate of $Cl_3$ is set to 80 sccm and an RF (13.56 MHZ) power of 350 W is given to a coiled electrode at a pressure of 1.2 Pa to generate plasma for 30 second etching. The substrate side (sample stage) receives an RF (13.56 MHZ) power of 50 W to apply a substantially negative self-bias voltage. First conductive layers 123c and 124c are formed through the third etching. (FIG. 2B)

Here, a first angle formed by a bottom surface and a side surface of the first conductive layer of the p-channel TFT may be larger than a second angle formed by a bottom surface and a side surface of the second conductive layer of the p-channel TFT.

An electrode comprising the first conductive layer 124c and the second conductive layer 124b serves as a gate electrode of the p-channel TFT in the pixel portion which is to be formed later. An electrode comprising the first conductive layer 123c and the second conductive layer 123b serves as a gate electrode of the p-channel TFT in the CMOS circuit which is to be formed later.

Leaving the resist masks 146 and 147 as they are, third doping treatment is conducted. Through the third doping treatment, the semiconductor layers to serve as active layers of p-channel TFTs are doped with an impurity element that imparts a conductivity type (p type) reverse to the conductivity type of the impurity used in the previous doping (n type). As a result, p type impurity regions (high concentration) 149 to 153 doped with the impurity element are formed. (FIG. 2C)

The p type impurity regions 149 to 153 in this embodiment are formed by ion doping using diborane ($B_2H_6$). The impurity regions 149 to 153 have been doped with phosphorus in varying concentration through the first doping treatment and the second doping treatment. However, the impurity regions 149 to 153 can function as source regions and drain regions of the p-channel TFTs without a problem by doping each of the regions with boron in a concentration of $2 \times 10^{20}$ to $2 \times 10^{21}$ atoms/$cm^2$.

The third doping treatment may be conducted after the gate insulating film 106 is selectively removed to expose the semiconductor layers.

Next, the resist masks 146 and 147 are removed to form a first interlayer insulating film 154. The first interlayer insulating film 154 is formed from an insulating film containing silicon to a thickness of 10 to 200 nm by plasma CVD or sputtering. The first interlayer insulating film 154 serves as an etching stopper to avoid over-etching of the semiconductor layers when contact holes are formed later in the insulating film reduced in thickness during the manufacture process. In this embodiment, a silicon oxide film with a thickness of 50 nm is formed by plasma CVD. The first interlayer insulating film 154 is not limited to the silicon oxide film, of course, and a single layer or laminate of other insulating films may also be used.

Next, the impurity elements used to dope the semiconductor layers are activated as shown in FIG. 2D. The activation is achieved by thermal annealing using an annealing furnace. The substrate is subjected to thermal annealing in a nitrogen atmosphere containing 1 ppm or less of oxygen, preferably 0.1 ppm or less of oxygen, at 400 to 700° C., typically 500 to 550° C. In this embodiment, the activation treatment is made through heat treatment at 550° C. for four hours. Other than thermal annealing, laser annealing or rapid thermal annealing (RTA) can be employed.

Though not shown in the drawing, the impurity elements are diffused through the activation treatment to thereby erase the border between the n type impurity regions (low concentration) and the impurity regions (high concentration) almost completely.

In this embodiment, nickel used as the catalyst in crystallization is gettered and moved to the impurity regions containing a high concentration of phosphorus at the same time the above activation treatment is conducted. As a result, the nickel concentration mainly in the semiconductor layers that serve as the channel formation regions is reduced. If a channel formation region thus formed is used in a TFT, the TFT can have high field effect mobility and excellent characteristics owing to reduced OFF current value and improved crystallinity.

The activation treatment may be conducted before forming the first interlayer insulating film. However, when the wiring line material used is weak against heat, it is preferred to form the first interlayer insulating film (an insulating film mainly containing silicon, for example, a silicon nitride film) first and then conduct the heat treatment as in this embodiment to protect the gate electrodes.

Next, heat treatment is conducted in a hydrogen atmosphere to hydrogenate the semiconductor layers. Other hydrogenating methods that can be used include plasma hydrogenation (using hydrogen excited by plasma).

When laser annealing is employed for the activation treatment, the substrate is desirably irradiated with laser light of an excimer laser, a YAG laser, or the like after the above hydrogenation.

A source wiring line 126 is formed next on the first interlayer insulating film. (FIG. 3A) The source wiring line 126 is preferably formed of a low resistant material, typically, aluminum or a material mainly containing aluminum.

Then a second interlayer insulating film 155 is formed so as to cover the source wiring line. An inorganic insulating film mainly containing silicon may be used for the second interlayer insulating film 155.

Although a case of forming the source wiring line 126 on the first interlayer insulating film is shown here, the source wiring line may be formed on the second interlayer insulating film. In this case, the second interlayer insulating film is formed using a silicon nitride film after the activation, heat treatment is conducted (at 300 to 550° C. for one to twelve hours) to hydrogenate the semiconductor layers and then the source wiring line is formed on the second interlayer insulating film. The hydrogenation in this case is for terminating dangling bonds in the semiconductor layers with hydrogen contained in the second interlayer insulating film.

Next, a third interlayer insulating film 156 is formed on the second interlayer insulating film 155 from an organic insulating material. In this embodiment, an acrylic resin film is formed to a thickness of 1.6 µm. Then contact holes reaching the impurity regions (137, 138, 149, 150, 151, 153, and 144), a contact hole reaching the source wiring line 126, and contact holes reaching the gate electrodes 124 are formed by patterning.

Formed next are electrodes 157, 158, 159, and 160 electrically connected to the impurity regions 137, 138, 149, and 150, respectively. Also formed are a pixel electrode 163 electrically connected to the impurity region 144 and to the impurity region 153, an electrode (connector electrode) 161 for electrically connecting the impurity region 151 that is to serve as a source region with the source wiring line 126, and a gate wiring line 162 electrically connected to the gate electrodes 124. These electrodes and the pixel electrode are formed from a material having excellent reflectivity, such as a film mainly containing Al or Ag, or a laminate of a film mainly containing Al and a film mainly containing Ag.

The impurity regions 135, 136, 144, and 145 functioning as one of electrodes of a capacitor storage 207 are doped with an impurity element that imparts the n type conductivity. The capacitor storage 207 comprises electrodes 239b and 239c and the semiconductor layers with the insulating film 106 as dielectric.

In this way, a driving circuit 201 including a CMOS circuit 202 that comprises an n-channel TFT 203 and a p-channel TFT 204 can be formed on the same substrate as that on which the pixel portion 205 having a pixel TFT 206 that is a p-channel TFT and the capacitor storage 207 is formed. (FIG. 3B) A substrate as this is called herein an active matrix substrate for conveniences' sake.

Figure 3:
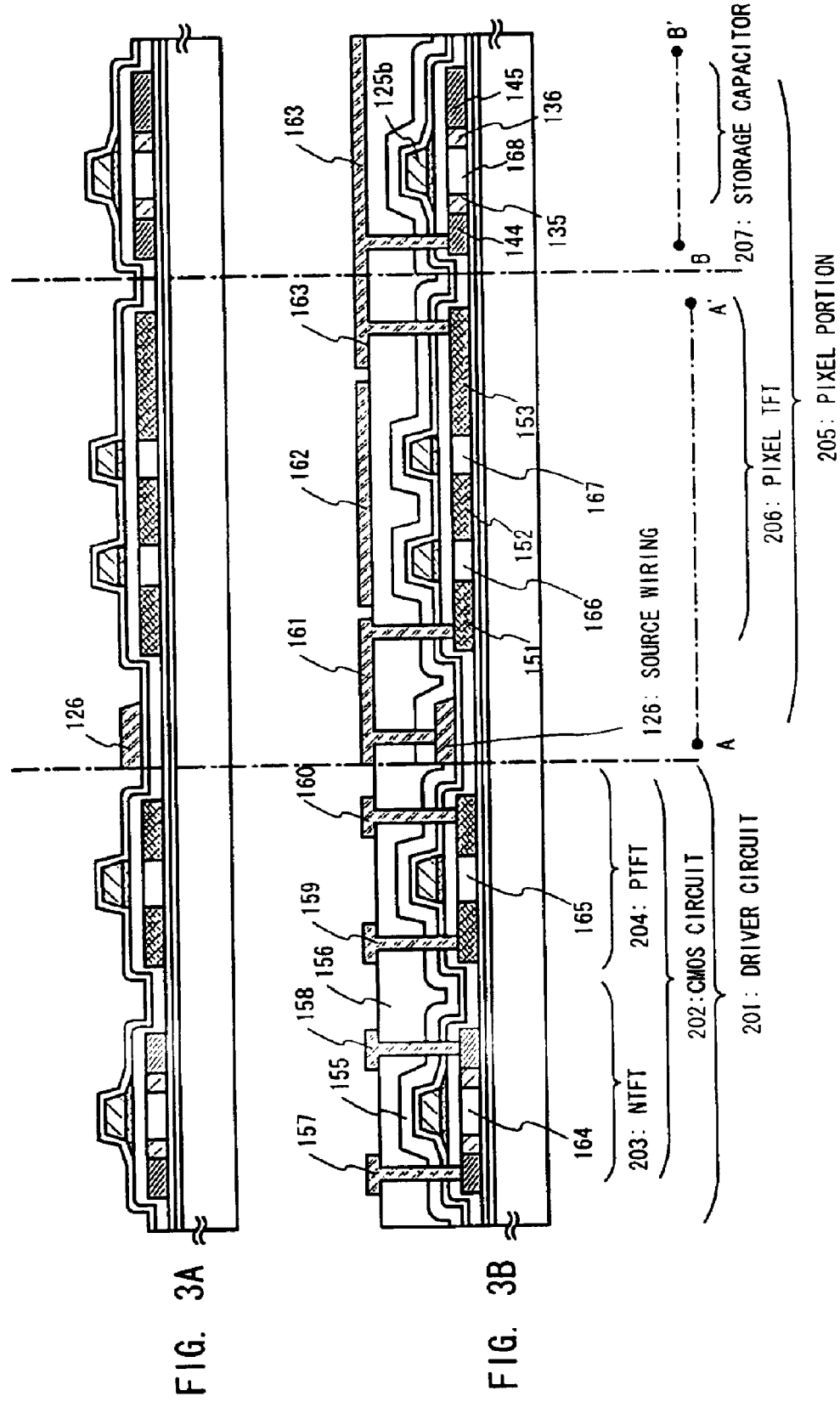
FIGS. 3A and 3B are diagrams showing an active matrix substrate.
Figure 4:
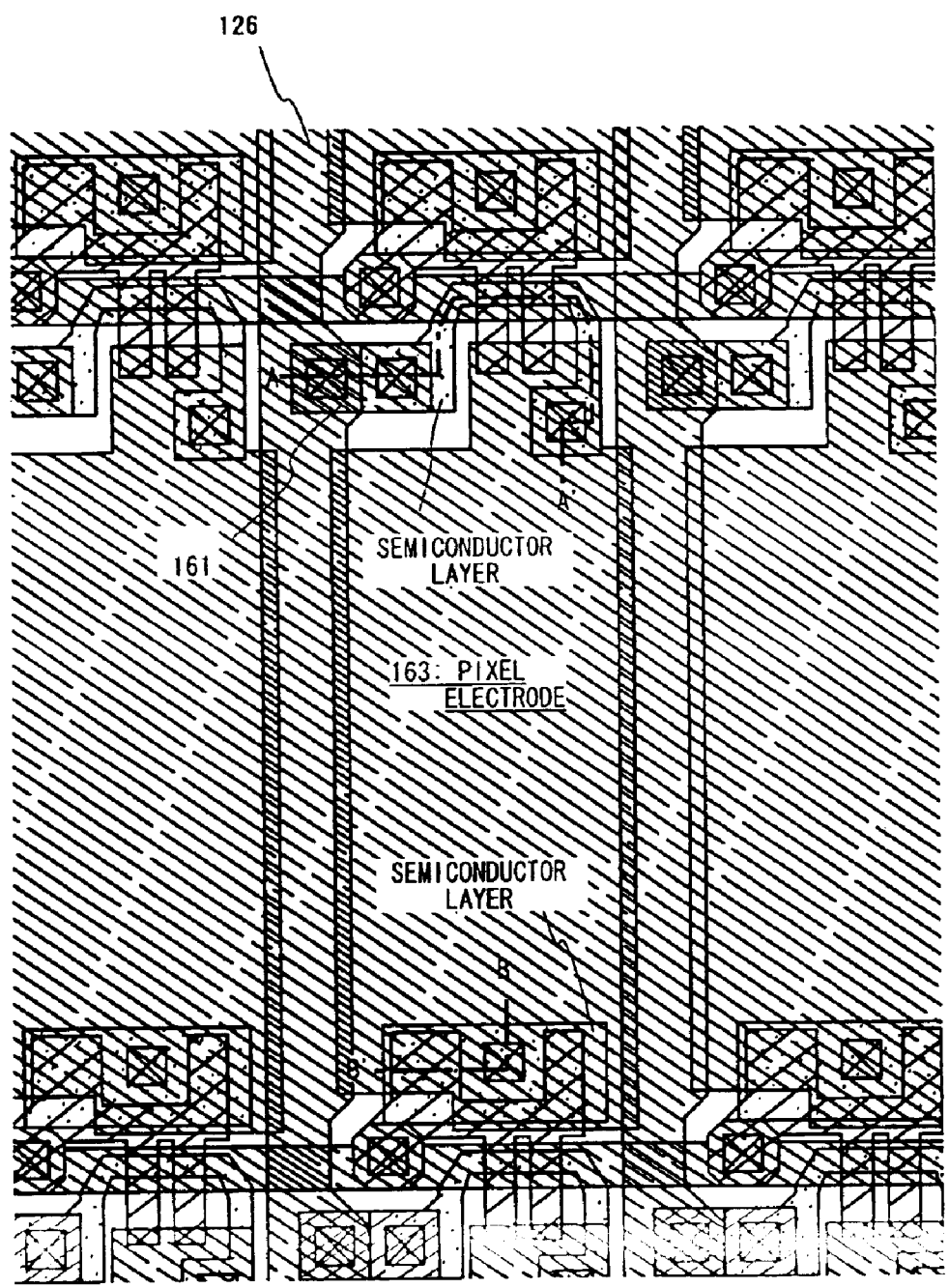
FIG. 4 is a top view of a pixel.

FIG. 4 is a top view of the pixel portion of the active matrix substrate fabricated in accordance with this embodiment. In FIG. 4, components corresponding to those in FIG. 3B are denoted by the same symbols. The sectional view indicated by the dot-dash line A–A' in FIG. 3 is taken along the dot-dash line A–A' in FIG. 4. The sectional view indicated by the dot-dash line B–B' in FIG. 3 is taken along the dot-dash line B–B' in FIG. 4.

In the pixel structure according to this embodiment, the edge of the pixel electrode 163 overlaps the source wiring line 126 so that a gap between pixel electrodes is shielded against light without using a black matrix.

The process shown in this embodiment requires only six photo masks in manufacturing an active matrix substrate.
[Embodiment 2]

In this embodiment, a process for manufacturing an active matrix liquid crystal display device using the active matrix substrate manufactured in Embodiment 1 will be described. The description is made with reference to FIG. 5.

First, after the active matrix substrate with the state of FIG. 3B is obtained according to Embodiment 1, an orientation film 301 is formed on the active matrix substrate of FIG. 3B to perform a rubbing process. Note that, in this embodiment, before the formation of the orientation film 301, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate 300 is prepared. A color filter in which a colored layer 302 and a light shielding layer 303 are arranged corresponding to each pixel is provided in this opposing substrate 300. Also, a light shielding layer 303 is provided in a portion of a driver circuit. A leveling film 304 for covering this color filter and the light shielding layer 303 is provided. Next, a counter electrode 305 made of a transparent conductive film is formed in a pixel portion on the leveling film 304, and then an orientation film 306 is formed on the entire surface of the opposing substrate 300 to perform a rubbing process.

Figure 5:
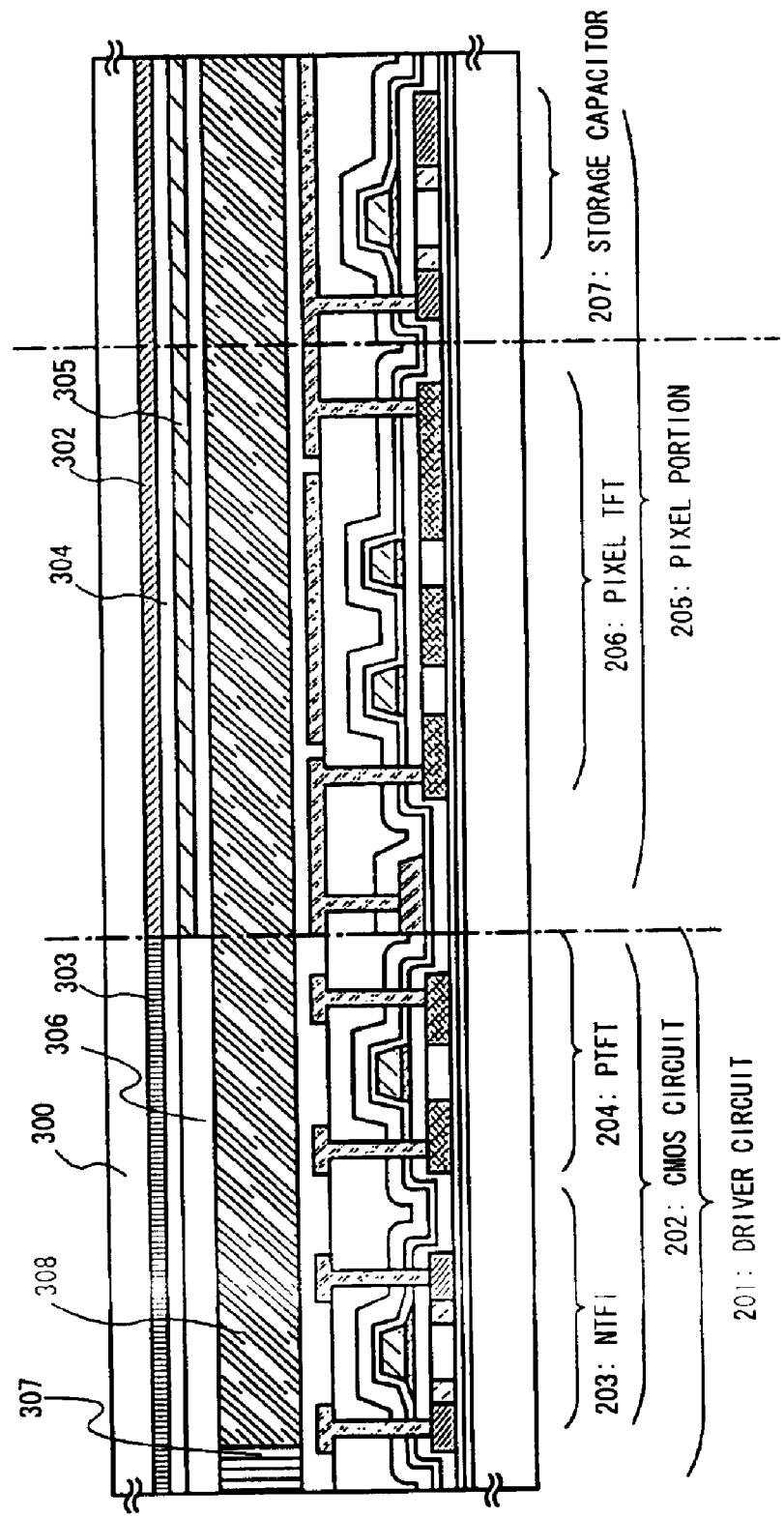
FIG. 5 is a diagram showing a sectional structure of an active matrix liquid crystal display device (Embodiment 2)

Then, the active matrix substrate in which the pixel portion and the driver circuit are formed and the opposing substrates are adhering to each other by using a sealing member 307. The filler is mixed with the sealing member 307, and two substrates are adhering to each other with a uniform interval by this filler and the columnar spacer. After that, a liquid crystal material 408 is injected into a space between both substrates and then completely encapsulated by a sealing member (not shown). A known liquid crystal material may be used as the liquid crystal material 308. Thus, the active matrix liquid crystal display device as shown in FIG. 5 is completed. If necessary, the active matrix substrate or the opposing substrate is cut with a predetermined shape. Also, a polarization plate and the like are suitably provided using a known technique. And, an FPC is adhering to the active matrix liquid crystal display device using a known technique.

A structure of a liquid crystal module thus obtained will be described using a top view of FIG. 6. Note that the same reference symbols are used for portions corresponding to those of FIG. 5.

Figure 6:
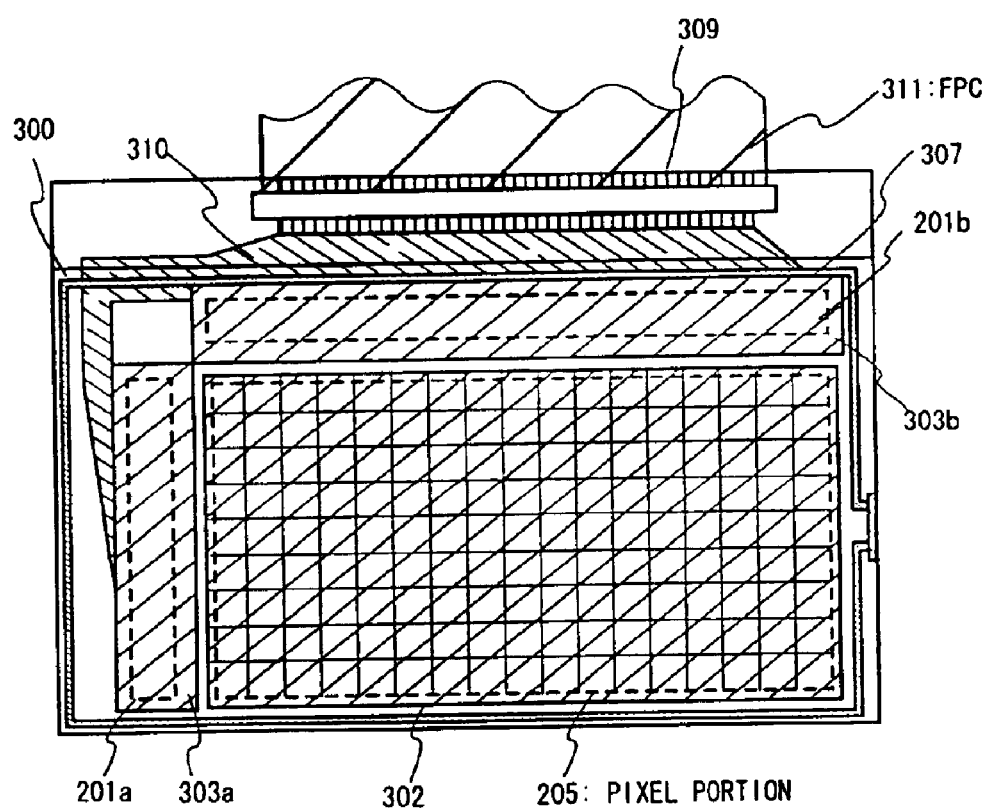
FIG. 6 is a diagram showing the exterior of the AM-LCD (Embodiment 2)

The top view of FIG. 6 shows the state that the active matrix substrate and the opposing substrate 300 are adhering to each other through the sealing member 307. Over the active matrix substrate, an external input terminal 309 to which the pixel portion, the driver circuit, and the FPC (flexible printed circuit) are adhering, a wiring 310 for connecting the external input terminal 309 with an input portion of the respective circuits, and the like are formed. Also, the color filter and the like are formed in the opposing substrate 300.

A light shielding layer 303a is provided in the opposing substrate side so as to overlap with a gate wiring side driver circuit 201a. Also, a light shielding layer 303b is provided in the opposing substrate side so as to overlap with a source wiring side driver circuit 201b. In a color filter 302 which is provided over the opposing substrate side on a pixel portion 302, a light shielding layer and colored layers for respective colors red color (R), green color (G), and blue color (B) are provided corresponding to each pixel. Actually, a color display is formed using three colors, that is, the colored layer for the red color (R), the colored layer for the green color (G), and the colored layer for the blue color (B). Note that the colored layers for respective colors are arbitrarily arranged.

Here, for a color display, the color filter 302 is provided over the opposing substrate. However, the present invention is not particularly limited to this case, and in manufacturing the active matrix substrate, the color filter may be formed over the active matrix substrate.

Also, in the color filter, the light shielding layer is provided between adjacent pixels such that a portion except for a display region is shielded. The light shielding layers 303a and 303b are provided in a region covering the driver circuit. However, when the liquid crystal display device is incorporated into an electronic device as a display portion thereof, the region covering the driver circuit is covered with a cover. Thus, the color filter may be constructed without the light shielding layer. In manufacturing the active matrix substrate, the light shielding layer may be formed over the active matrix substrate.

Also, without providing the light shielding layer, the colored layers composing the color filter may be suitably arranged between the opposing substrate and the counter electrode such that light shielding is made by a lamination layer laminated with a plurality of layers. Thus, the portion except for the display region (gaps between pixel electrodes) and the driver circuit may be light-shielded.

Also, the FPC 411 which comprises the base film and the wiring is adhering to the external input terminal by using an anisotropic conductive resin. Further, a reinforced plate is provided to increase a mechanical strength.

The liquid crystal module manufactured above can be used as the display portion of various electronic equipment.
[Embodiment 3]

Although the third doping process is performed after the third etching process in embodiment 1, the example that the third etching process is performed after the third doping process is described in FIG. 7 in this embodiment. In addition, the example of transmission type is shown in FIG. 8 in this embodiment.

Figures 7A, 7B, 7C:
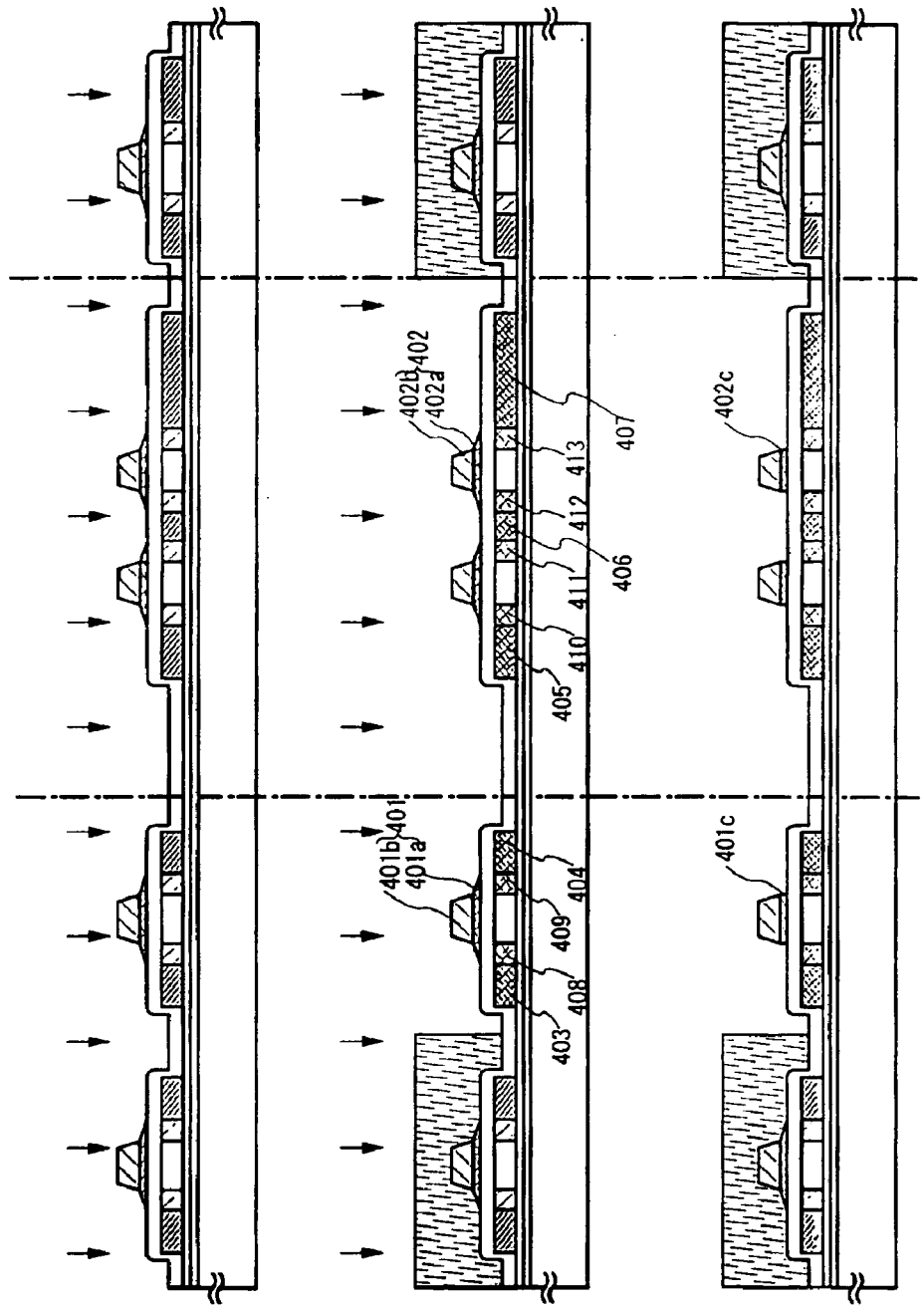
FIGS. 7A to 7C are diagrams showing a process of manufacturing an AM-LCD (Embodiment 3)
Figure 8:
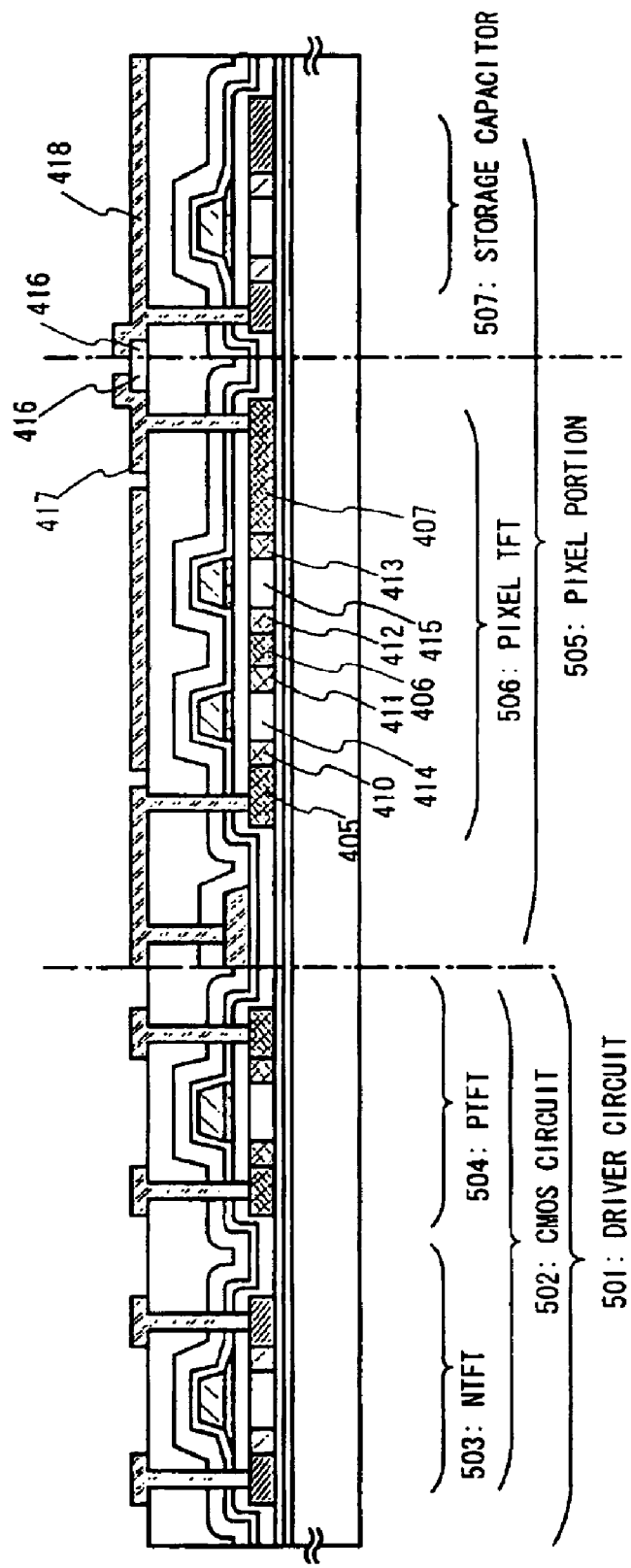
FIG. 8 is a diagram showing an active matrix substrate (Embodiment 3)

First, the same state as that shown in FIG. 7A is obtained in according to Embodiment 1. The figure shown in FIG. 7A is the same as that shown in FIG. 2A in Embodiment 1.

When the same state as that shown in FIG. 7A is obtained, the third doping method is performed after the region which become n-channel TFT is covered by resist masks. By this third doping process, p-type impurity regions 403 to 413 (impurity regions (high concentration) 403 to 407 and impurity regions (low concentration) 408 to 413) added impunity elements imparting inverse conductivity type (p-type) to an above-mentioned conductivity type (n-type) are formed on the semiconductor layer which become an active layer of the p-channel type TFT. The p-type low concentration impurity regions 408 to 413 has a same concentration gradient as that of n-type impurity region (low concentration) because doping is implemented by passing the taper portion. (FIG. 7B)

Next, the third etching process is performed left the mask from resist as it is. In the third etching process, the first conductive layers 401c and 402c are formed by etching selectively the taper portion of the first conductive layer.

Next, in the same way of Embodiment 1, the mask from resist is removed and the first interlayer insulating film is formed. Next, the activation process is performed according to Embodiment 1, the second interlayer insulating film and the third interlayer insulating film are formed.

Next, the transparent conductive film is formed on the third interlayer insulating film, and the pixel electrode 416 from a transparent conductive film is patterned by using the photomask. Thereafter, the contact hole is formed. Next, an electrode contacting with an impurity region, connecting electrode 417 overlapping the pixel electrode 416 and the connecting electrode 418 overlapping the pixel electrode 416.

Above-mentioned processes, the pixel TFT 506 and the retention capacitor 507 from the p-channel type TFT are formed in the pixel portion 505.

The detailed explanation of the driver circuit 501 is omitted here because its structure is the same as that of Embodiment 1. The n-channel type TFT 503 is equivalent to the n-channel type TFT 203 in FIG. 4 and the p-channel type TFT 504 is equivalent to the p-channel type TFT 204 in FIG. 4.

Furthermore, if the processes described in this embodiment are conducted, the number of photomasks required for manufacturing an active matrix substrate may be six. This shortens production processes, and contributes to the reduction in a production cost and enhancement of yield.

However, substrates used in the embodiment are the substrate having transmittance, for example, a glass substrate, a quartz substrate and a plastic substrate.

Further, this embodiment can be combined with Embodiment 2.
[Embodiment 4]

Figure 9:
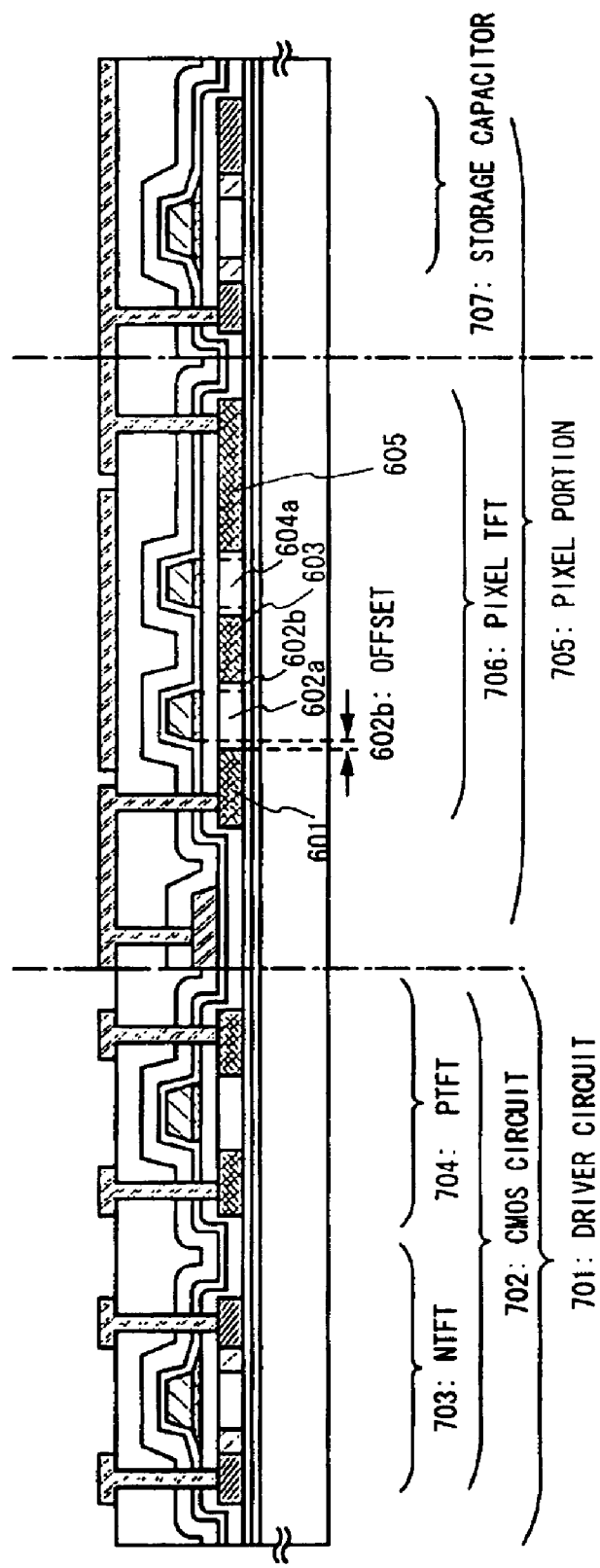
FIG. 9 is a diagram showing an active matrix substrate (Embodiment 4)

This embodiment shows a case of providing an offset region between a channel formation region and an impurity region with reference to FIG. 9.

An offset region as the one shown in FIG. 9 is formed, for example, as follows. The third doping treatment of FIG. 2C in Embodiment 1 is conducted, the fourth etching treatment is performed while keeping the resist masks in their places, and then the width of the gate electrode is reduced. Subsequent steps are the same as those in Embodiment 1.

Through the above steps, a pixel TFT 706 that is a p-channel TFT having the double gate structure and a capacitor storage 707 are formed in a pixel portion 705.

The pixel TFT 706 has an offset region 602b between a source region 601 and a channel formation region 602a. With the offset region 602b, OFF current of the pixel TFT can be reduced. Similarly, another offset region 602b is placed between an impurity region 603 and the channel formation region 602a. Also, an offset region is provided between the impurity region 603 and a channel formation region 604a and another offset region is provided between a drain region 605 and the channel formation region 604a.

The capacitor storage 707 and an n-channel TFT 703 of a driving circuit 701 are structured in the same way as described in Embodiment 1. Accordingly, detailed descriptions thereof are omitted here. The capacitor storage 707 corresponds to the capacitor storage 207 in FIG. 4, and the n-channel TFT 703 corresponds to the n-channel TFT 203 in FIG. 4. A p-channel TFT 704 shown here has an offset region similar to the TFT of the pixel portion. However, the p-channel TFT 704 may have the same structure as the p-channel TFT of Embodiment 1 by using one more mask and covering the p-channel TFT of the driving circuit with a resist mask before the fourth etching.

This embodiment may be combined with Embodiment 2.

[Embodiment 5]

Figure 10:
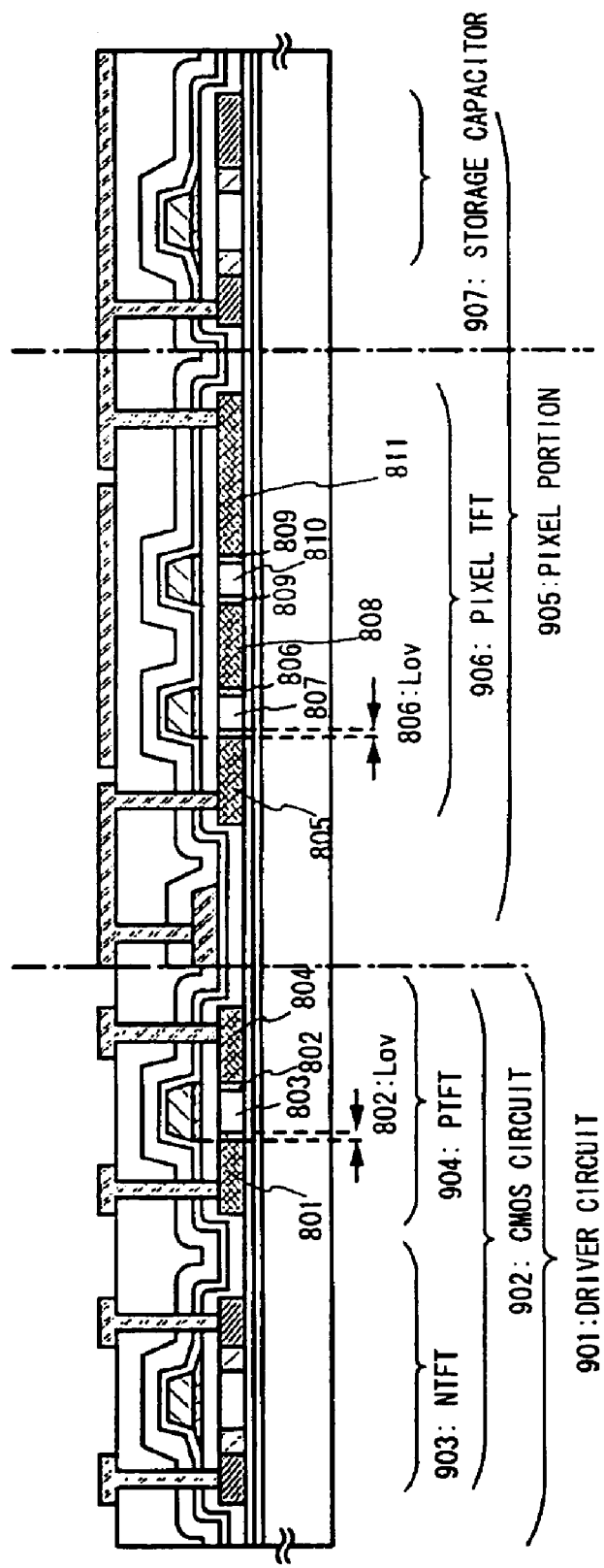
FIG. 10 is a diagram showing an active matrix substrate (Embodiment 5)

This embodiment shows a case of providing an LDD region that overlaps a gate electrode in a pixel TFT that is a p-channel TFT. The description thereof will be given with reference to FIG. 10. An impurity region that overlaps a gate electrode (Lov region) as the one shown in FIG. 10 is formed, for example, by changing doping conditions in the third doping treatment of FIG. 2C in Embodiment 1 to ones that allow the semiconductor layers below the edges of the gate electrodes to be doped with the impurity element. Alternatively, the third doping treatment in Embodiment 1 is followed by another doping treatment with modified doping conditions. Impurity regions 802, 806, and 809 thus formed below the edges of the gate electrodes are regions having an impurity concentration lower than the impurity concentration of impurity regions 801, 804, 805, 808, and 811 that do not overlap gate electrodes. Low concentration regions as these are called here LDD regions, and LDD regions that overlap gate electrodes are simply called as Lov regions. Subsequent steps are the same as those in Embodiment 1.

Through the above steps, a pixel TFT 906 that is a p-channel TFT having the double gate structure and a capacitor storage 907 are formed in a pixel portion 905.

The pixel TFT 906 has an LDD region (Lov region) 806 between a source region 805 and a channel formation region 807. With the LDD region (Lov region), the reliability is improved. Similarly, another LDD region (Lov region) 806 is placed between an impurity region 808 and the channel formation region 807. An LDD region (Lov region) 809 is provided between the impurity region 808 and a channel formation region 810 and another LDD region (Lov region) 809 is provided between a drain region 811 and the channel formation region 810.

The capacitor storage 907 and an n-channel TFT 903 of a driving circuit 901 are structured in the same way as described in Embodiment 1. Accordingly, detailed descriptions thereof are omitted here. The capacitor storage 907 corresponds to the capacitor storage 207 in FIG. 4, and the n-channel TFT 903 corresponds to the n-channel TFT 203 in FIG. 4. A p-channel TFT 904 shown here has an LDD region (Lov region) 802 between a channel formation region 803 and a source region 801 and another LDD region (Lov region) 802 between the channel formation region 803 and a drain region 804 similar to the TFT of the pixel portion. Forming the LDD regions (Lov regions) in the driving circuit is effective, since they can improve the reliability.

This embodiment may be combined with Embodiment 2.

[Embodiment 6]

Figure 12:
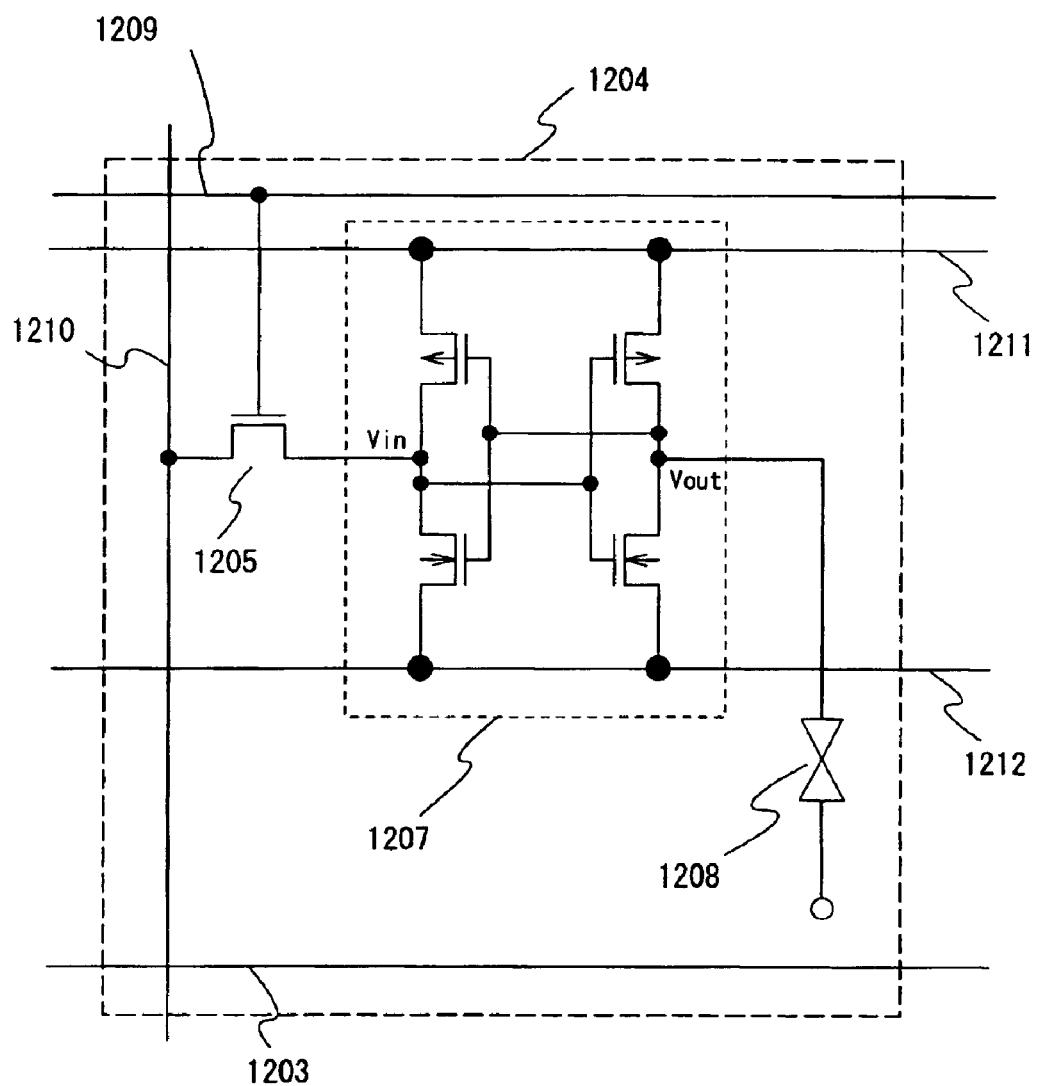
FIG. 12 is a circuit diagram in which a pixel has a built-in SRAM.

This embodiment describes a case of providing a pixel with a SRAM with reference to FIG. 12. FIG. 12 is an equivalent circuit diagram.

A pixel 1204 is provided with a pixel TFT 1205, a SRAM 1207, and a liquid crystal cell 1208 that has a liquid crystal sandwiched between an opposite electrode and a pixel electrode.

A gate electrode of the pixel TFT 1204 is connected to a gate wiring line 1209. The pixel TFT 1204 has a source region and a drain region one of which is connected to a source signal line 1210 and the other of which is connected to the input side of the SRAM 1207.

The SRAM has two p-channel TFTs and two n-channel TFTs. Source regions of the p-channel TFTs are connected to a high voltage side power supply line 1211 and kept at a power supply Vddh. Source regions of the n-channel TFTs are connected to a low voltage side power supply line 1212 and kept at a power supply Vss. Vddh and Vss satisfy Vddh>Vss. One n-channel TFT and one p-channel TFT forms a pair. Then one SRAM has two pairs of p-channel TFTs and n-channel TFTs.

The p-channel TFT and the n-channel TFT in a pair are connected to each other at their drain regions. Also, the p-channel TFT and the n-channel TFT in a pair are connected to each other at their gate electrodes. Drain regions of the p-channel TFT and the n-channel TFT in a pair are kept at the same level of electric potential as gate electrodes of the p-channel TFT and the n-channel TFT in the other pair. Drain regions of the p-channel TFT and the n-channel TFT in a pair are the input side to which an input signal (Vin) is inputted, whereas drain regions of the p-channel TFT and the n-channel TFT in the other pair are the output side from which an output signal (Vout) is outputted.

SRAM is designed to hold Vin and output Vout that is a signal obtained by inverting Vin. Accordingly, when Vin is Hi, Vout is a signal Lo corresponding to Vss and Vout is a signal Hi corresponding to Vddh when Vin is Lo.

The output side of the SRAM is connected to a pixel electrode of the liquid crystal cell.

A selecting signal is inputted to the gate signal line to turn the pixel TFT ON. Then digital video signals inputted to the source signal line are inputted as Vin to the input side of the SRAM through the pixel TFT.

The inputted digital video signals are held in the SRAM until the next set of digital video signals is inputted. The SRAM requires shorter time period than a DRAM in writing digital video signals and data can be written in the SRAM at high speed.

The digital video signals carry information of '1' or '0', and the digital video signals inputted to the SRAM are outputted from the SRAM with their information inverted. For example, when a digital video signal having information of '1' is inputted to the SRAM, a digital video signal having information of '0' is outputted as Vout from the output side of the SRAM. On the other hand, a digital video signal having information of '1' is outputted as Vout from the output side of the SRAM when a digital video signal having information of '0' is inputted to the SRAM.

The digital video signals outputted from the output of the SRAM are inputted to the pixel electrode of the liquid crystal cell. The liquid crystal is driven in accordance with information of '1' or '0' of the digital video signals to control the amount of light that is transmitted.

The digital video signals are similarly inputted to all of pixels, thereby deciding for each pixel whether or not its liquid crystal cell is turned ON.

After digital video signals of all bits are inputted to all of pixels, one image is displayed. Gray scale display can be obtained by controlling lengths of periods in one frame period in which a liquid crystal cell of each pixel transmits light. Another method to obtain gray scale display is a method of setting plural pixels as a unit and controlling the area of units of pixels whose liquid crystal cells are transmitting light.

In the present invention, digital video signals inputted to a pixel can be held more securely until the next set of digital video signals is inputted by providing the SRAM in the pixel. To elaborate, reduction of electric charges held in the pixel electrode of the liquid crystal cell due to leak current of the pixel TFT is prevented to thereby prevent the amount of light transmitted through the liquid crystal cell from varying.

A volatile memory can be comprising TFTs and therefore can be formed at the same time the pixel TFT is formed.

A capacitor storage may not always be provided in the present invention. When there is no capacitor storage, a period of time required to input digital video signals to a pixel can be shorter. Therefore the length of a writing period can be short even for a liquid crystal display device having a large number of pixels.

This embodiment may be combined freely with structures shown in Embodiments 1, 2, 4, and 5.

[Embodiment 7]

A driving circuit and a pixel portion obtained in accordance with the present invention can be employed in various kinds of modules (active matrix liquid crystal modules, active matrix EL modules, and active matrix EC modules). In other words, the present invention can be applied to all of electronic equipment with those modules incorporated therein as display units.

Given as examples of such electronic equipment are video cameras, digital cameras, head-mounted displays (goggle type displays), navigation systems for automobiles, projectors, car audio systems, personal computers, and portable information terminals (mobile computers, cellular phones, electronic books and the like). Some of them are shown in FIGS. 13A to 14B.

Figure 13A:
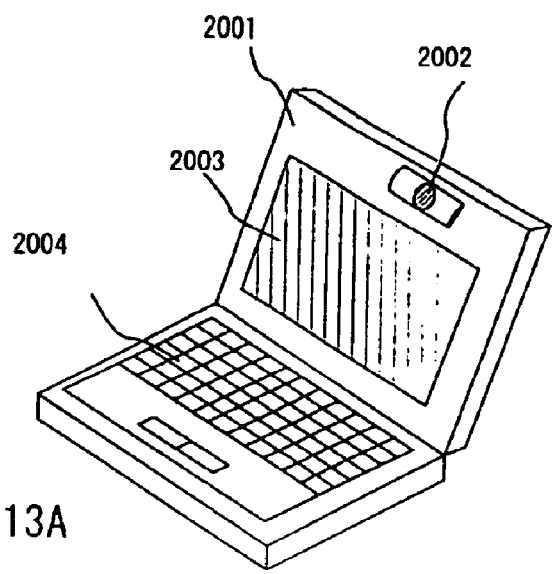
FIGS. 13A to 13C are diagrams showing examples of electronic equipment.

FIG. 13A shows a personal computer, which comprises a main body 2001, an image inputting unit 2002, a display unit 2003, a keyboard 2004, etc. The present invention is applicable to the display unit 2003.

Figure 13B:
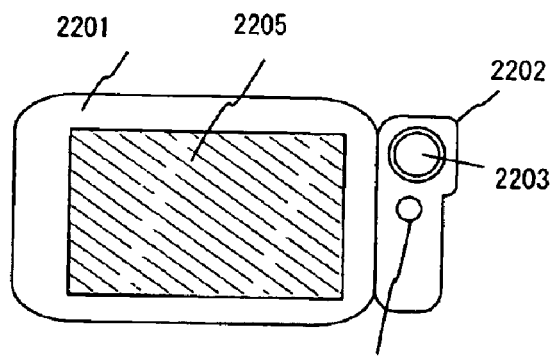

FIG. 13B shows a mobile computer, which comprises a main body 2201, a camera unit 2202, an image receiving unit 2203, operation switches 2204, a display unit 2205, etc. The present invention is applicable to the display unit 2205.

Figure 13C:
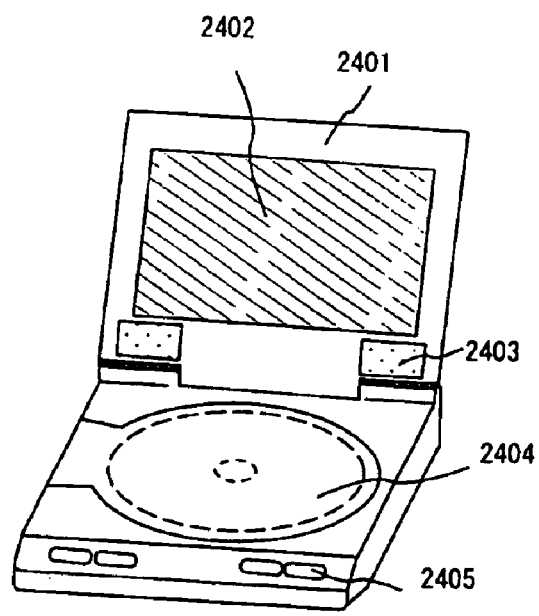

FIG. 13C shows a player using a recording medium in which a program is recorded (hereinafter abbreviated as a recording medium). The player comprises a main body 2401, a display unit 2402, speaker units 2403, a recording medium 2404, operation switches 2405, etc. This player uses as a recording medium a DVD (digital versatile disk), a CD, and the like for enjoying music and movies, playing games, and accessing the Internet. The present invention is applicable to the display unit 2402.

Figure 14A:
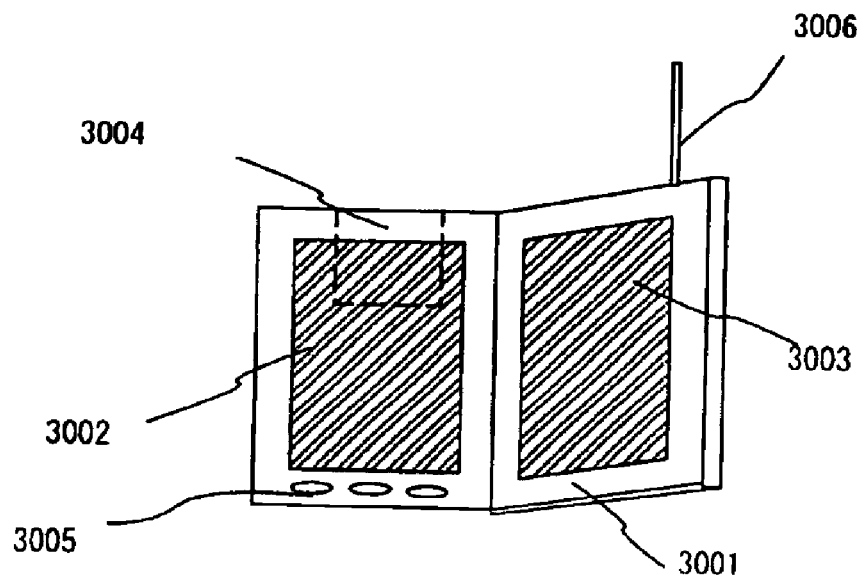
FIGS. 14A and 14B are diagrams showing examples of electronic equipment.

FIG. 14A shows a portable electronic book, which comprises a main body 3001 display units 3002 and 3003, a recording medium 3004, operation switches 3005, an antenna 3006, etc. The present invention is applicable to the display units 3002 and 3003.

Figure 14B:
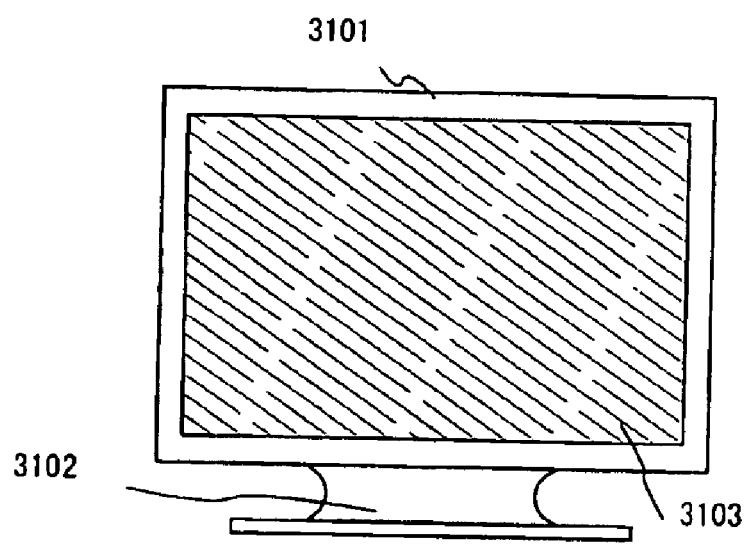

FIG. 14B shows a display, which comprises a main body 3101, a supporting base 3102, a display unit 3103, etc. The present invention is applicable to the display unit 3103.

As described above, application range of the present invention is so wide that it can be applied to electronic equipment of every field. The electronic equipment of this embodiment can employ any structure obtained by combining Embodiments 1 through 6.

The present invention can reduce power consumption of a semiconductor device represented by an active matrix liquid crystal display device even when its pixel portion is made to have a larger area and the screen is made to be larger.

What is claimed is:

1. A semiconductor device comprising at least a pixel portion and a driving circuit portion, the pixel portion having at least one p-channel TFT and the driving circuit portion having at least an n-channel TFT and a p-channel TFT, each of the at least one n-channel TFT and the p-channel TFTs comprising:

a semiconductor layer formed on an insulating surface;

an insulating film formed on the semiconductor layer; and a gate electrode formed on the insulating film, wherein the gate electrode of the n-channel TFT of the driving circuit portion has a laminate structure with a first conductive layer as a lower layer and a second conductive layer as an upper layer, the first conductive layer having a first width and the second conductive layer having a second width that is narrower than the first width, and wherein the gate electrode of the p-channel TFT of at least the pixel portion has a laminate structure comprising a third conductive layer and a fourth conductive layer over the third conductive layer, wherein a first angle formed by a bottom surface and a side surface of the third conductive layer is larger than a second angle formed by a bottom surface and a side surface of the fourth conductive layer.

2. A device according to claim 1, wherein edge of the first conductive layer of the n-channel TFT of the driving circuit portion is tapered in section.

3. A device according to claim 1, wherein the p-channel TFT of the pixel portion comprises a plurality of channel formation regions.

4. A device according to claim 1, wherein in the n-channel TFT of the driving circuit portion, the gate electrode has a tapered portion, and the semiconductor layer comprises a channel forming region overlapping the gate electrode and an impurity region partially overlapping the gate electrode.

5. A device according to claim 4, wherein the impurity region of the n-channel TFT has a region that has an impurity concentration gradient in a range of at least $1 \times 10^{17}$ to $1 \times 10^{18}$ atoms/cm$^3$, and the impurity concentration thereof increases as the distance from the channel forming region increases.

6. A device according to claim 4, wherein the impurity region of the n-channel TFT includes a source region or a drain region.

7. A device according to claim 4, wherein a source wiring line is formed on a first insulating film that covers the gate electrode in the pixel portion, wherein an electrode connected to one of the impurity regions of the p-channel TFT of the pixel portion is formed on a second insulating film that covers the source wiring line, and wherein the electrode and a pixel electrode comprise the same material.

8. A device according to claim 1, wherein the p-channel TFT of at least the pixel portion has an LDD region between one channel forming region and a source region, or between the channel forming region and a drain region in the semiconductor layer.

9. A device according to claim 1, wherein the p-channel TFT of at least the pixel portion has an offset region between a channel forming region and a source region, or between the channel forming region and a drain region in the semiconductor layer.

10. A device according to claim 1, wherein a gate wiring line is formed on an insulating film that covers the gate electrode in the pixel portion, and wherein the gate wiring line and a pixel electrode connected to the impurity region of the p-channel TFT of the pixel portion comprise the same material.

11. A device according to claim 1, wherein the semiconductor device is an electric equipment selected from the group consisting of a video camera, a digital camera, a navigation system for automobiles, a personal computer, a portable information terminal, a digital video disc player, or an electronic game machine.

12. A semiconductor device comprising at least a pixel portion and a driving circuit portion, the pixel portion having at least one p-channel TFT and the driving circuit portion having at least an n-channel TFT and a p-channel TFT, each of the p-channel TFTs comprising:

a first semiconductor layer formed on an insulating surface;

an insulating film formed on the semiconductor layer; and a plurality of first gate electrodes formed on the insulating film, wherein in the at least one p-channel TFT of the pixel portion, each of the plurality of first gate electrodes has a tapered portion, and the first semiconductor layer comprises:

a plurality of first channel forming regions overlapping the plurality of first gate electrodes respectively; and a first impurity region partially overlapping one of the first gate electrodes, wherein each of the first gate electrodes of the p-channel TFT of the pixel portion comprises a first conductive layer and a second conductive layer over the first conductive layer, wherein a first angle formed by a bottom surface and a side surface of the first conductive layer of the p-channel TFT of the pixel portion is larger than a second angle formed by a bottom surface and a side surface of the second conductive layer of the p-channel TFT of the pixel portion, and wherein the at least one n-channel TFT of the driving circuit portion comprises, a second gate electrode has having a tapered portion, and a second semiconductor layer comprising a second channel forming region overlapping the second gate electrode; and a second impurity region partially overlapping the second gate electrode.

13. A device according to claim 12, wherein a gate wiring line is formed on an insulating film that covers the plurality of gate electrodes in the pixel portion, and wherein the gate wiring line and a pixel electrode connected to the first impurity region of the p-channel TFT of the pixel portion comprise the same material.

14. A device according to claim 12, wherein a source wiring line is formed on a first insulating film that covers the plurality of gate electrodes in the pixel portion, wherein an electrode connected to the impurity region of the of the p-channel TFT of the pixel portion is formed on a second insulating film that covers the source wiring line, and wherein the electrode and a pixel electrode comprise the same material.

15. A device according to claim 12, wherein the semiconductor device is an electric equipment selected from the group consisting of a video camera, a digital camera, a navigation system for automobiles, a personal computer, a portable information terminal, a digital video disc player, or an electronic game machine.

16. A device according to claim 12, wherein edge of the first conductive layer of the n-channel TFT of the driving circuit portion is tapered in section.

17. A device according to claim 12, wherein the second impurity region of the n-channel TFT includes one of a source region and a drain region.

18. A device according to claim 12, wherein the p-channel TFT of at least the pixel portion has an LDD region between one of the first channel forming region and a source region, or between one of the first channel forming region and a drain region in the first semiconductor layer.

19. A device according to claim 12, wherein the p-channel TFT of at least the pixel portion has an offset region between one of the first channel forming region and a source region, or between the first channel forming region and a drain region in the first semiconductor layer.

20. A device according to claim 12, wherein the semiconductor device is an electric equipment selected from the group consisting of a video camera, a digital camera, a navigation system for automobiles, a personal computer, a portable information terminal, a digital video disc player, or an electronic game machine.

21. A semiconductor device comprising at least a pixel portion and a driving circuit portion, said semiconductor device comprising:

a semiconductor layer formed on an insulating surface, the semiconductor layer comprising at least one channel forming region and impurity regions;

a gate electrode formed adjacent to the semiconductor layer with a gate insulating film interposed therebetween, the gate electrode having a laminate structure with a first conductive layer as a lower layer and a second conductive layer as an upper layer;

an insulating film formed over the gate electrode; and a gate wiring line formed over the insulating film, wherein the pixel portion comprises at least one p-channel TFT and the driving circuit portion has at Least an n-channel TFT and a p-channel TFT, wherein, in the gate electrode of the n-channel TFT of the driving circuit portion, the first conductive layer having a first width and the second conductive layer having a second width that is narrower than the first width, and wherein, in the gate electrode of the p-channel TFT of the pixel portion, an upper surface of the first conductive layer and a lower surface of the second conductive layer have the same width, and wherein the gate wiring line comprises the same material as a pixel electrode connected to the impurity region of the p-channel TFT of the pixel portion.

22. A device according to claim 21, wherein the semiconductor device is at least an electric equipment selected from the group consisting of a video camera, a digital camera, a navigation system for automobiles, a personal computer, a portable information terminal, a digital video disc player, or an electronic game machine.

23. A semiconductor device comprising at least a pixel portion and a driving circuit portion, the pixel portion having at least one n-channel TFT and the driving circuit portion having at least an n-channel TFT and a p-channel TFT, each of the at least one n-channel TFT and the p-channel TFTs comprising:

a semiconductor layer formed on an insulating surface, the semiconductor layer comprising at least one channel forming region and impurity regions; and a gate electrode formed adjacent to the semiconductor layer with a gate insulating film interposed therebetween, the gate electrode having a laminate structure with a first conductive layer as a lower layer and a second conductive layer as an upper layer;

wherein the semiconductor device further comprises:

a first insulating film formed over the gate electrode;

a source wiring line formed on the first insulating film; and a second insulating film formed on the source wiring line, wherein, in the gate electrode of the n-channel TFT of the driving circuit portion, the first conductive layer has a first width and the second conductive layer has a second width that is narrower than the first width, and wherein, in the gate electrode of the p-channel TFT of the pixel portion a first angle formed by a bottom surface and a side surface of the first conductive layer of the p-channel TFT of the pixel portion is larger than a second angle formed by a bottom surface and a side surface of the second conductive layer of the p-channel TFT of pixel portion, and wherein the pixel portion further comprises:

an electrode formed on the second insulating film and connected to one of the impurity regions of the p-channel TFT of the pixel portion; and a pixel electrode formed on the second insulating film and comprising the same material as said electrode.

24. A device according to claim 23, wherein the semiconductor device is an electric equipment selected from the group consisting of a video camera, a digital camera, a navigation system for automobiles, a personal computer, a portable information terminal, a digital video disc player, or an electronic game machine.

25. A device according to claim 23, wherein edge of the first conductive layer of the n-channel TFT of the driving circuit portion is tapered in section.

26. A device according to claim 23, wherein the p-channel TFT of the pixel portion comprises a plurality of channel formation regions.

27. A device according to claim 23, wherein in the n-channel TFT of the driving circuit portion, the gate electrode has a tapered portion, and an impurity region partially overlapping the gate electrode.

28. A device according to claim 23, wherein the impurity region of the n-channel TFT of the driving circuit portion partially overlaps the gate electrode of the n-channel TFT of the driving circuit portion.

29. A device according to claim 23, wherein the impurity region of the n-channel TFT includes one of a source region and a drain region.

30. A device according to claim 23, wherein each of the impurity regions of the at least one p-channel TFT in the pixel portion comprises:

one of a source region and a drain region; and an LDD region between the channel forming region and the one of a source region and a drain region.

31. A device according to claim 23, wherein the at least one p-channel TFT in the pixel portion has an offset region between the channel forming region and one of the impurity regions.

32. A device according to claim 23, wherein a gate wiring line is formed on the first insulating film, and wherein the gate wiring line and a pixel electrode connected to one of the impurity regions of the p-channel TFT of the pixel portion comprise the same material.

33. A device according to claim 23, wherein the semiconductor device is an electric equipment selected from the group consisting of a video camera, a digital camera, a navigation system for automobiles, a personal computer, a portable information terminal, a digital video disc player, or an electronic game machine.

* * * * *